United States Patent
Blanksby et al.

(10) Patent No.: US 8,091,013 B2
(45) Date of Patent: Jan. 3, 2012

(54) MULTI-CODE LDPC (LOW DENSITY PARITY CHECK) DECODER

(75) Inventors: Andrew J. Blanksby, Neptune, NJ (US); Alvin Lai Lin, Londonderry (GB)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/191,664

(22) Filed: Jul. 27, 2011

(65) Prior Publication Data

US 2011/0283161 A1 Nov. 17, 2011

Related U.S. Application Data

(63) Continuation of application No. 11/843,553, filed on Aug. 22, 2007, now Pat. No. 8,010,881.

(60) Provisional application No. 60/958,014, filed on Jul. 2, 2007, provisional application No. 60/954,182, filed on Aug. 6, 2007.

(51) Int. Cl.
*H03M 13/03* (2006.01)

(52) U.S. Cl. ........ 714/786; 714/800; 714/801; 714/807; 714/758

(58) Field of Classification Search .................. 714/758, 714/786, 800, 801, 807
See application file for complete search history.

(56) References Cited

U.S. PATENT DOCUMENTS

| | | | | |
|---|---|---|---|---|
| 7,373,581 B2* | 5/2008 | Okamura et al. | | 714/752 |
| 7,436,902 B2* | 10/2008 | Shen et al. | | 375/308 |
| 7,607,065 B2* | 10/2009 | Bickerstaff et al. | | 714/755 |
| 7,617,441 B2* | 11/2009 | Lee et al. | | 714/800 |
| 7,617,442 B2* | 11/2009 | Shen et al. | | 714/801 |
| 7,631,241 B2* | 12/2009 | Park et al. | | 714/752 |
| 7,644,339 B2* | 1/2010 | Tran et al. | | 714/758 |
| 7,743,315 B2* | 6/2010 | Li et al. | | 714/801 |
| 7,900,127 B2* | 3/2011 | Shen et al. | | 714/804 |
| 2008/0052594 A1* | 2/2008 | Yedidia et al. | | 714/758 |
| 2008/0126917 A1* | 5/2008 | Huang | | 714/801 |
| 2008/0215950 A1* | 9/2008 | Shen et al. | | 714/755 |
| 2010/0115386 A1* | 5/2010 | Zhu et al. | | 714/801 |

OTHER PUBLICATIONS

Zhu et al., A Reduced-Complexity, Scalable Implementation of Low Density Parity Check (LDPC) Decoder, Feb. 2006, IEEE, pp. 83-88.*

* cited by examiner

*Primary Examiner* — John J Tabone, Jr.
(74) *Attorney, Agent, or Firm* — Garlick Harrison & Markison; Shayne X. Short

(57) ABSTRACT

Multi-code LDPC (Low Density Parity Check) decoder. Multiple LDPC coded signals can be decoded using hardware provisioned for a minimum requirement needed to decode each of the multiple LDPC coded signals. In embodiments where each LDPC matrix (e.g., employed to decode each LDPC coded signal) includes a common number of non-null sub-matrices, then a same number of memories are employed when decoding each LDPC coded signal. However, those particular memories employed can be different subsets for when decoding each LDPC coded signal. In embodiments where each LDPC code includes a different number of non-null sub-matrices within its respective LDPC matrix, then a different number of memories are employed when decoding each LDPC coded signal. Various degrees of parallelism in decoding can also be employed in which different numbers of bit engines and check engines can be employed when decoding different LDPC coded signals.

20 Claims, 20 Drawing Sheets

| decoding signals encoded according to: | # of non-null sub-matrices | # bit engines employed | # check engines employed | # of memories used for each code (Y=total # of memories) | which memories used for each code (Y=total # of memories) |
|---|---|---|---|---|---|
| code 1 | X | all | all | X of Y | subset 1 of Y |
| code 2 | X | all | all | X of Y | subset 2 of Y |
| code 3 | X | all | all | X of Y | subset 1 of Y |
| code 4 | X | all | all | X of Y | subset 3 of Y |
| code n | X | all | all | X of Y | subset n of Y | hardware provisioning 1300

Fig. 13 hardware provisioning 1400 (varying degrees of parallelism)

| decoding signals encoded according to: | # of non-null sub-matrices | # bit engines employed (M=total #) | # check engines employed (L=total #) | # of memories used for each code (Z=total # of memories) | which memories used for each code (Z=total # of memories) |
|---|---|---|---|---|---|
| code a | a1 | a2 of M | a3 of L | a2 or a3 of Z | subset a4 of Z |
| code b | b1 | b2 of M | b3 of L | b2 or b3 of Z | subset b4 of Z |
| code c | c1 | c2 of M | c3 of L | c2 or b3 of Z | subset c4 of Z |
| code d | d1 | d2 of M | d3 of L | d2 or b3 of Z | subset d4 of Z |

∘∘∘

| code e | e1 | e2 of M | e3 of L | e2 or e3 of Z | subset e4 of Z |
|---|---|---|---|---|---|

Fig. 14

MULTI-CODE LDPC (LOW DENSITY PARITY CHECK) DECODER

CROSS REFERENCE TO RELATED PATENTS/PATENT APPLICATIONS
CONTINUATION PRIORITY CLAIM, 35 U.S.C. §120

The present U.S. Utility Patent Application claims priority pursuant to 35 U.S.C. §120, as a continuation, to the following U.S. Utility Patent Application which is hereby incorporated herein by reference in its entirety and made part of the present U.S. Utility Patent Application for all purposes:

1. U.S. Utility patent application Ser. No. 11/843,553, entitled "Multi-code LDPC (Low Density Parity Check) decoder," filed Aug. 22, 2007, now issued as U.S. Pat. No. 8,010,881 on Aug. 30, 2011, which claims priority pursuant to 35 U.S.C. §119 (e) to the following U.S. Provisional Patent Applications which are hereby incorporated herein by reference in their entirety and made part of the present U.S. Utility Patent Application for all purposes:
 a. U.S. Provisional Application Ser. No. 60/958,014, entitled "Distributed processing LDPC (Low Density Parity Check) decoder," filed Jul. 2, 2007, now expired.
 b. U.S. Provisional Application Ser. No. 60/954,182, entitled "Multi-code LDPC (Low Density Parity Check) decoder," filed Aug. 6, 2007, now expired.

INCORPORATION BY REFERENCE

The following U.S. Utility Patent Applications are hereby incorporated herein by reference in their entirety and made part of the present U.S. Utility Patent Application for all purposes:

1. U.S. Utility patent application Ser. No. 11/828,532, entitled "Distributed processing LDPC (Low Density Parity Check) decoder," filed Jul. 26, 2007, now issued as U.S. Pat. No. 7,958,429 on Jun. 7, 2011.

BACKGROUND OF THE INVENTION

1. Technical Field of the Invention

The invention relates generally to communication systems; and, more particularly, it relates to decoding of LDPC (Low Density Parity Check) coded signals within such communication systems.

2. Description of Related Art

Data communication systems have been under continual development for many years. One such type of communication system that has been of significant interest lately is a communication system that employs iterative error correction codes. Of particular interest is a communication system that employs LDPC (Low Density Parity Check) code. Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the highest theoretically possible data rate to be used in a communication channel, having a particular SNR, that achieves error free transmission through the communication channel. In other words, the Shannon limit is the theoretical bound for channel capacity for a given modulation and code rate.

LDPC codes have been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code with a length of one million, it nevertheless demonstrates the very promising application of LDPC codes within communication systems.

The use of LDPC coded signals continues to be explored within many newer application areas. Some examples of possible communication systems that may employ LDPC coded signals include communication systems employing 4 wire twisted pair cables for high speed Ethernet applications (e.g., 10 Gbps (Giga-bits per second) Ethernet operation according to the IEEE 802.3an (10 GBASE-T) emerging standard) as well as communication systems operating within a wireless context (e.g., in the IEEE 802.11 context space including the IEEE 802.11n emerging standard).

For any of these particular communication system application areas, near-capacity achieving error correction codes are very desirable. The latency constraints, which would be involved by using traditional concatenated codes, simply preclude their use in such applications in very high data rate communication system application areas.

Generally speaking, within the context of communication systems that employ LDPC codes, there is a first communication device at one end of a communication channel with encoder capability and second communication device at the other end of the communication channel with decoder capability. In many instances, one or both of these two communication devices includes encoder and decoder capability (e.g., within a bi-directional communication system). LDPC codes can be applied in a variety of additional applications as well, including those that employ some form of data storage (e.g., hard disk drive (HDD) applications and other memory storage devices) in which data is encoded before writing to the storage media, and then the data is decoded after being read/retrieved from the storage media.

In many such prior art communication devices, one of the greatest hurdles and impediments in designing effective devices and/or communication devices that can decode LDPC coded signals is the typically large area and memory required to store and manage all of the updated bit edge messages and check edge messages that are updated and employed during iterative decoding processing (e.g., when storing and passing the check edges messages and the bit edges messages back and forth between a check engine and a bit engine, respectively). When dealing with relatively large block sizes in the context of LDPC codes, the memory requirements and memory management needed to deal with these check edges messages and bit edges messages can be very difficult to handle. There has been and continues to be a need in the art for better means by which LDPC coded signal can be decoded to extract the information encoded therein.

Moreover, when the size of a low density parity check matrix, H, employed to decode an LDPC coded signal reaches a certain size, the interconnectivity between a first processing module and a second processing module (e.g., a check engine and a bit engine) can significantly increase.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 13 and FIG. 14 illustrate embodiments of hardware provisioning for decoding non-null sub-matrices of a superimposed LDPC matrix.

DETAILED DESCRIPTION OF THE INVENTION

Figure 1:
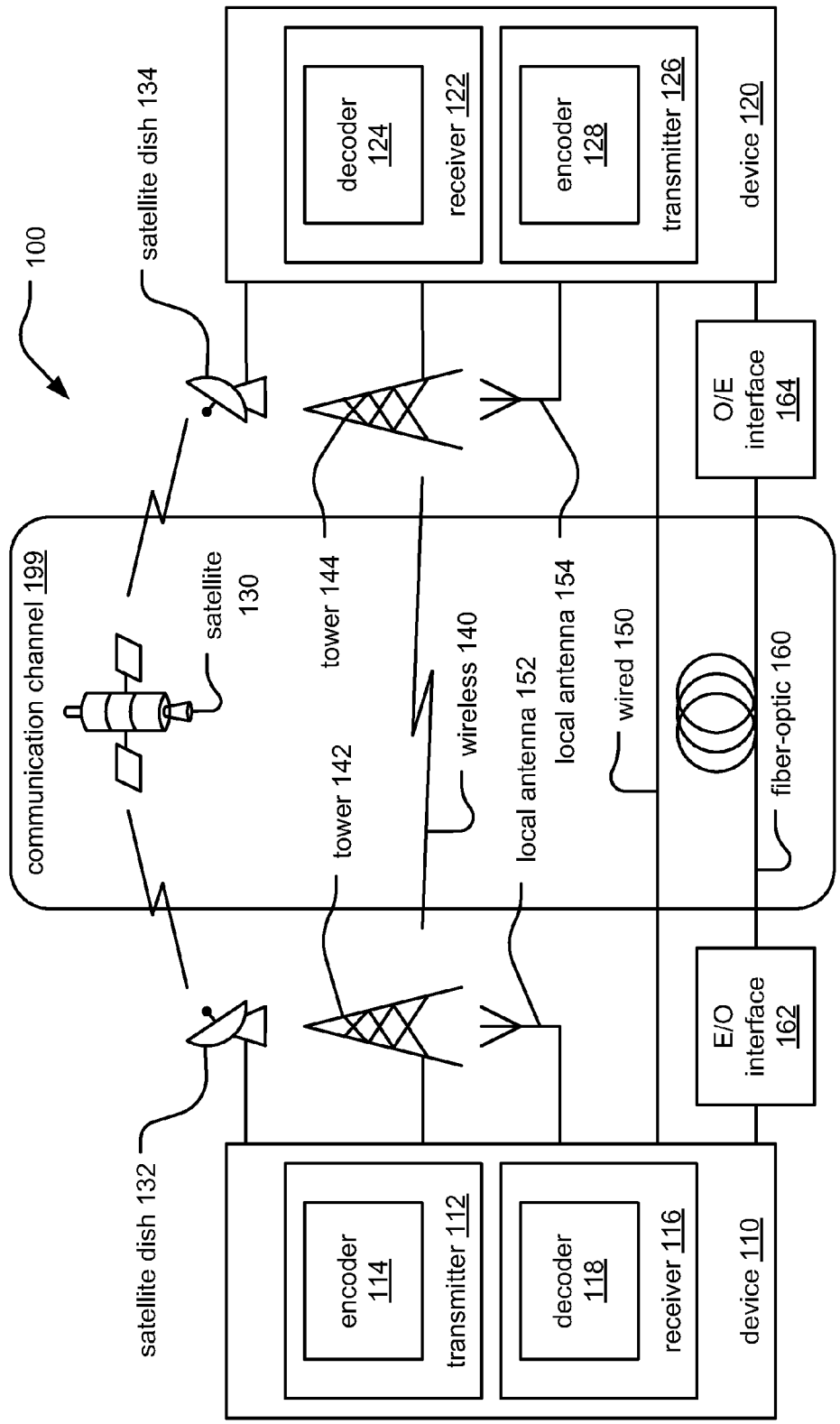
FIG. 1 and FIG. 2 illustrate various embodiments of communication systems.

LDPC (Low Density Parity Check) codes are capacity approaching forward error correcting codes (ECCs) that are being adopted in an increasing number of communication standards (e.g., IEEE 802.3an, IEEE 802.11n, 802.20, DVB-S2). Relevant application domains include magnetic recording, wireless, and high speed data transmission over copper and optical fiber.

In one embodiment, LDPC decoding processing is performed using an iterative decoding approach in which messages (e.g., check edge messages and bit edge messages [or alternatively referred to as "variable edge messages"]) are passed back and forth when performing check node processing (sometimes alternatively referred to as check engine processing) and bit node processing (sometimes alternatively referred to as bit engine processing). This is sometimes referred to as message passing decoding processing that operates on a graph representation of the code (e.g., a LDPC bipartite graph (also sometimes referred to as a "Tanner" graph in the art)).

Within many communication applications that employ LDPC coded signals, it is necessary and/or desirable to support more than code. There can be a variety of reasons why this may be desirable. From one perspective, each of the different codes could be used under different noise conditions and/or data characteristics. For example, as the operating conditions within the communication system change (e.g., change in SNR), then the particular code being used could also be changed adaptively to accommodate those changed conditions while still maintaining an acceptable level of performance (e.g., acceptably high throughput with acceptably low error rate). From even another perspective, a transceiver can be implemented to support a set of codes for different communication protocols as a multi-protocol transceiver. Many applications also operate using LDPC codes whose corresponding LDPC matrices are sub-matrix-based, and some of those LDPC matrices employ permuted sub-matrices.

For example, the IEEE 802.11n standard specifies 12 different LDPC codes which are based on a sub-matrix construction. Similarly, the IEEE 802.16e standard specifies 24 different LDPC codes, also based on a sub-matrix construction. These are just some examples of applications in which certain aspects of this invention can be employed.

This means presented herein pertains to an efficient approach of reducing the decoder implementation complexity by exploiting the sub-matrix construction of the LDPC matrices of the family of codes that the decoder needs to support. As typically the decoder need only support a single code out of the family of codes at any one instant of time (e.g., when decoding a particular coded signal generated using a particular LDPC code), the decoder architecture presented herein is provisioned such that memory elements and computation units can be efficiently shared. This significantly reduces the decoder memory storage and computation unit requirements resulting in a smaller decoder area.

Moreover, means is also presented herein by which a number of related techniques can be employed to derive a "merged" decoder architecture from the super-position of all LDPC codes in a family of LDPC codes that must be supported within a particular application. The merging techniques exploit null sub-matrices in the construction of individual codes, and metrics based on proximity in the graph representation of the LDPC codes.

It is noted that the means presented herein can also be applied within other LDPC decoding architectures including those described within the U.S. provisional patent application and U.S. utility patent application described above, each having a title of "Distributed processing LDPC (Low Density Parity Check) decoder".

A novel means is presented herein by which a single communication device and/or hardware can be employed to perform decoding of various LDPC coded signals. Each of these LDPC coded signals has a corresponding LDPC matrix by which the decoding processing is performed. In some embodiment, each of these LDPC matrices corresponding to each of the LDPC codes can have a same number of sub-matrices. In other embodiments, the number of sub-matrices in each of these LDPC matrices need not be the same. This approach is geared towards minimizing the area overhead within the communication device and also reducing the routing congestion therein as well.

This approach can be employed to design a communication device that is operable to decode multiple LDPC coded signals. For example, one embodiment can be employed to arrive at a communication device that is operable to decode LDPC coded signals generated using any one of the 12 codes employed in accordance with the IEEE 802.11n standard. Moreover, the approach presented herein can be optimized using merging of memories (e.g., such as those employed when decoding mutually exclusive sub-matrices of different LDPC matrices).

There is a variety of approaches to arrive at a minimum number of provisioned hardware within a communication device that is operable to decode multiple LDPC coded signals. For example, one straightforward approach involves superimposing each of the LDPC matrices corresponding to each of the LDPC codes onto one another. Whenever a sub-matrix location in the resulting, superimposed LDPC matrix includes a non-null entry, then a memory is provisioned for that sub-matrix location. This straightforward superposition approach will result in sufficient hardware provisioning for decoding multiple LDPC coded signals. In addition, additional hardware savings that can be achieved from this straightforward superposition approach as described in other embodiments below.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber, copper, and other types of media as well.

Figure 2:
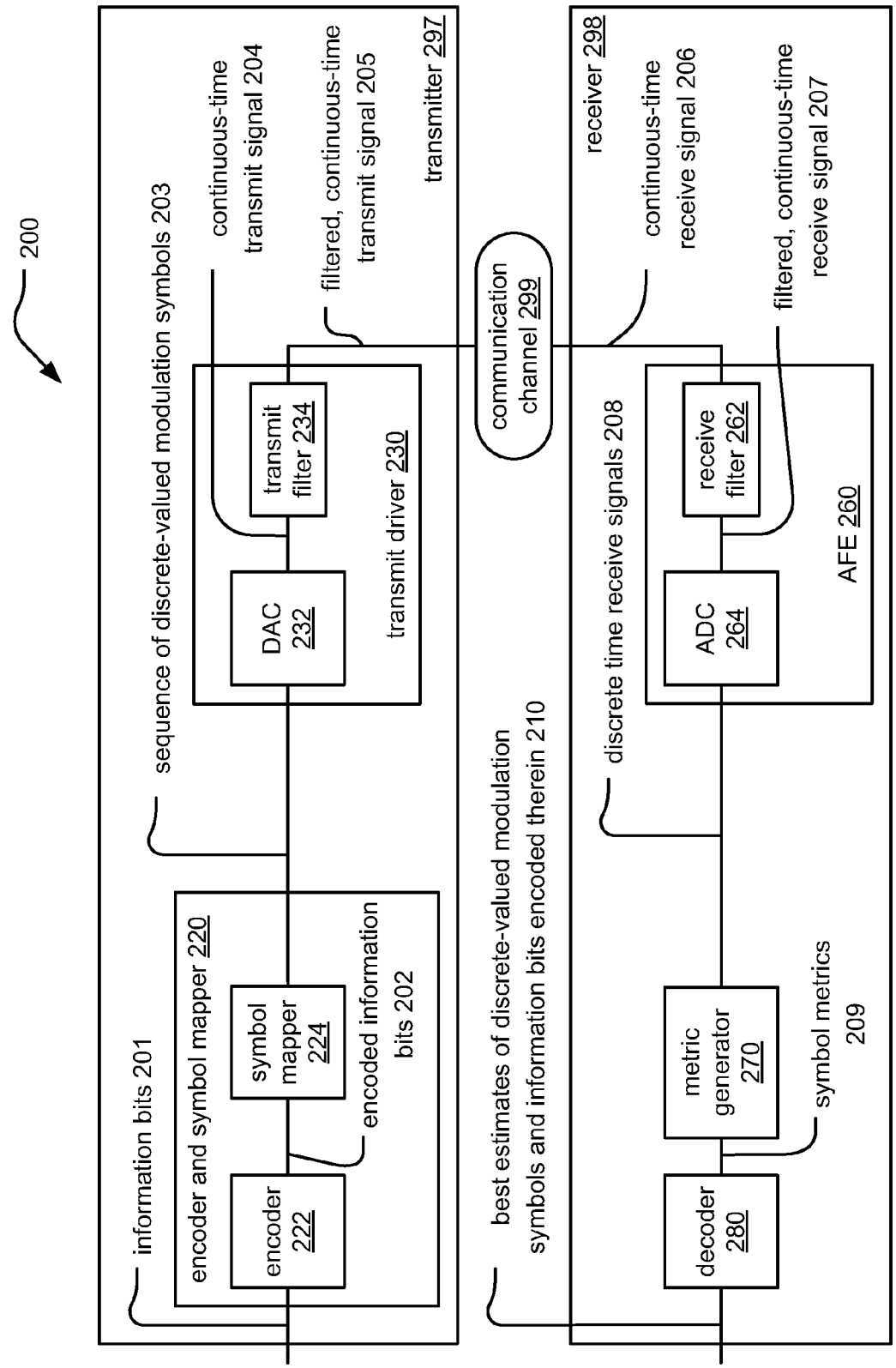

FIG. 1 and FIG. 2 are diagrams illustrate various embodiments of communication systems, 100 and 200, respectively.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter and a decoder at the receiver.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 that is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). A metric generator 270 calculates symbol metrics 209 that are employed by a decoder 280 to make best estimates of the discrete-valued modulation symbols and information bits encoded therein 210.

The decoders of either of the previous embodiments may be implemented to include various aspects and/or embodiment of the invention therein. In addition, several of the following Figures describe other and particular embodiments (some in more detail) that may be used to support the devices, systems, functionality and/or methods that may be implemented in accordance with certain aspects and/or embodiments of the invention. One particular type of signal that is processed according to certain aspects and/or embodiments of the invention is an LDPC coded signal. Before more details are provided below, a general description of LDPC codes is provided.

Figure 3:
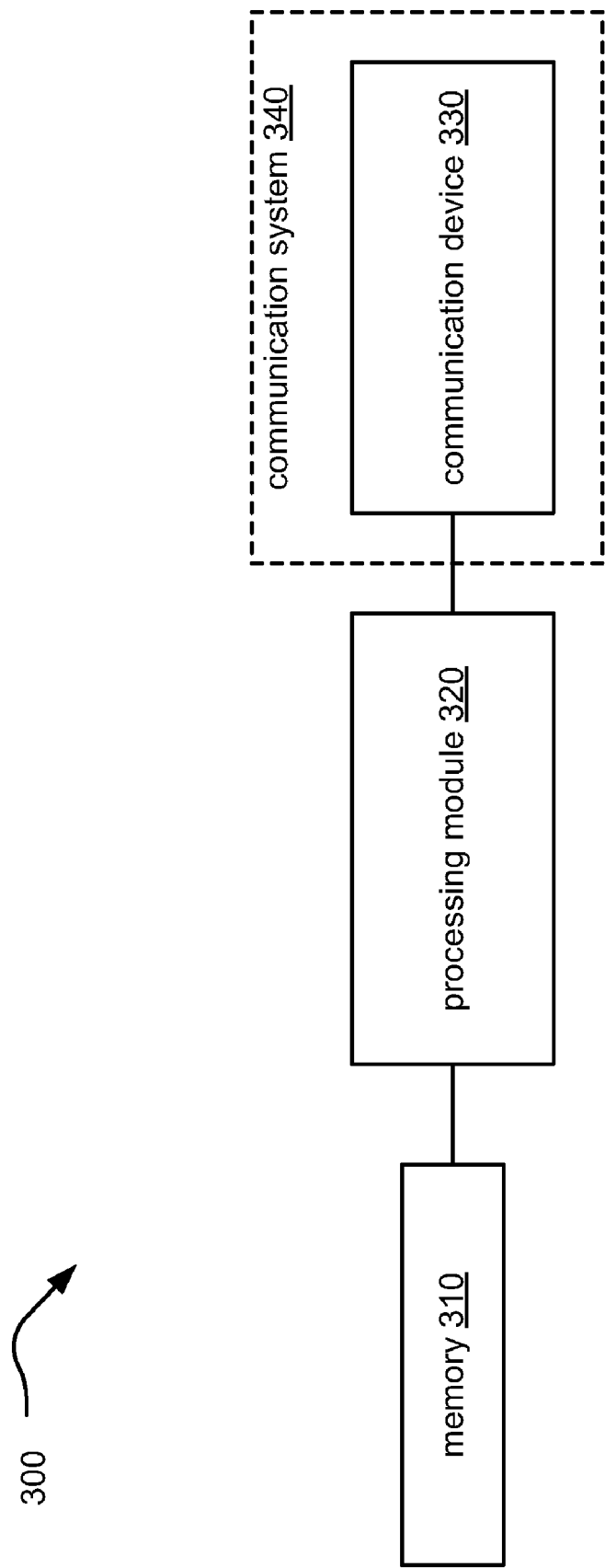
FIG. 3 illustrates an embodiment of an apparatus that is operable to perform LDPC decoding processing.

FIG. 3 illustrates an embodiment of an apparatus 300 that is operable to perform LDPC decoding processing. The apparatus 300 includes a processing module 320, and a memory 310. The memory 310 is coupled to the processing module, and the memory 310 is operable to store operational instructions that enable the processing module 320 to perform a variety of functions. The processing module 320 is operable to perform and/or direct the manner in which LDPC decoding processing is to be performed in accordance with any embodiment described herein, or any equivalent thereof.

The processing module 320 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 310 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 320 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the manner in which the LDPC decoding processing is to be performed (e.g., the portion, module, and/or functional block that is moved from a check engine into a bit engine) can be provided from the apparatus 300 to a communication system 340 that is operable to employ and perform LDPC coding using a desired LDPC code. For example, information corresponding to the LDPC code being used (e.g., the parity check matrix of the LDPC code) can also be provided from the processing module 320 to any of a variety of communication devices 330 implemented within the communication system 340 as well. In addition, the manner in which such LDPC decoding is to be performed within any of a variety of communication devices 330 implemented within the communication system 340 can also be provided from the processing module 320.

If desired, the apparatus 320 can be designed to generate multiple means of performing LDPC decoding in accordance with multiple needs and/or desires as well. In some embodiments, the processing module 320 can selectively provide different information (e.g., corresponding to different LDPC codes, etc.) to different communication devices and/or communication systems. That way, different communication links between different communication devices can employ different LDPC codes and/or means by which to perform LDPC decoding. Clearly, the processing module 320 can also provide the same information to each of different communication devices and/or communication systems as well without departing from the scope and spirit of the invention.

Figure 4:
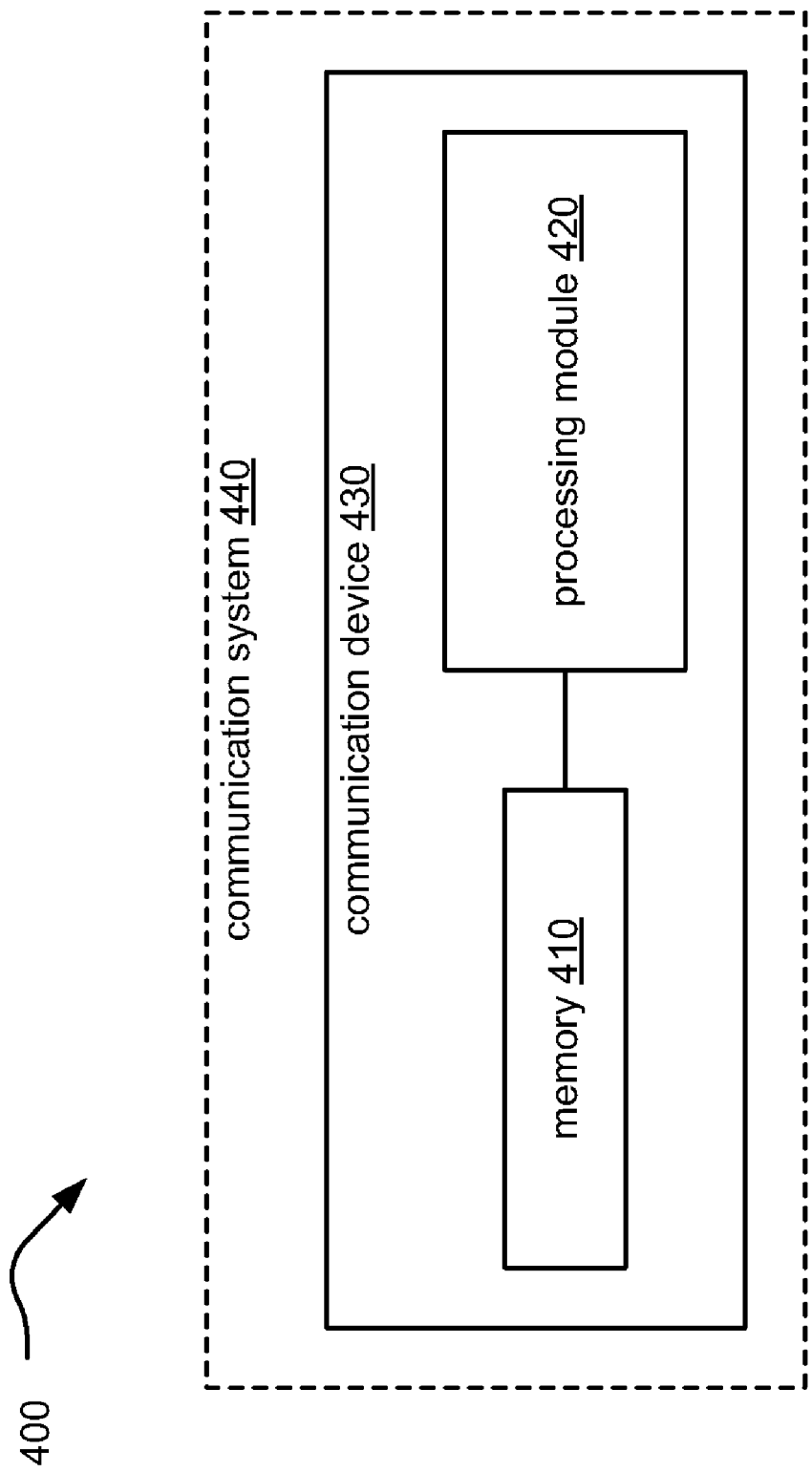
FIG. 4 illustrates an alternative embodiment of an apparatus that is operable to perform LDPC decoding processing.

FIG. 4 illustrates an alternative embodiment of an apparatus 400 that is operable to perform LDPC decoding processing. The apparatus 400 includes a processing module 420, and a memory 410. The memory 410 is coupled to the processing module, and the memory 410 is operable to store operational instructions that enable the processing module 420 to perform a variety of functions. The processing module 420 (serviced by the memory 420) can be implemented as an apparatus capable to perform any of the functionality of any of the various modules and/or functional blocks described herein. For example, the processing module 420 (serviced by the memory 420) can be implemented as an apparatus capable to perform and/or direct the manner in which LDPC decoding processing is to be performed in accordance with any embodiment described herein, or any equivalent thereof.

The processing module 420 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 410 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 420 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the apparatus 400 can be any of a variety of communication devices 430, or any part or portion of any such communication device 430. Any such communication device that includes the processing module 420 and/or memory 410 can be implemented within any of a variety of communication systems 440 as well. It is also noted that various embodiments of LDPC decoding processing in accordance with LDPC decoding processing as presented herein, and equivalents thereof, may be applied to many types of communication systems and/or communication devices.

Figure 5:
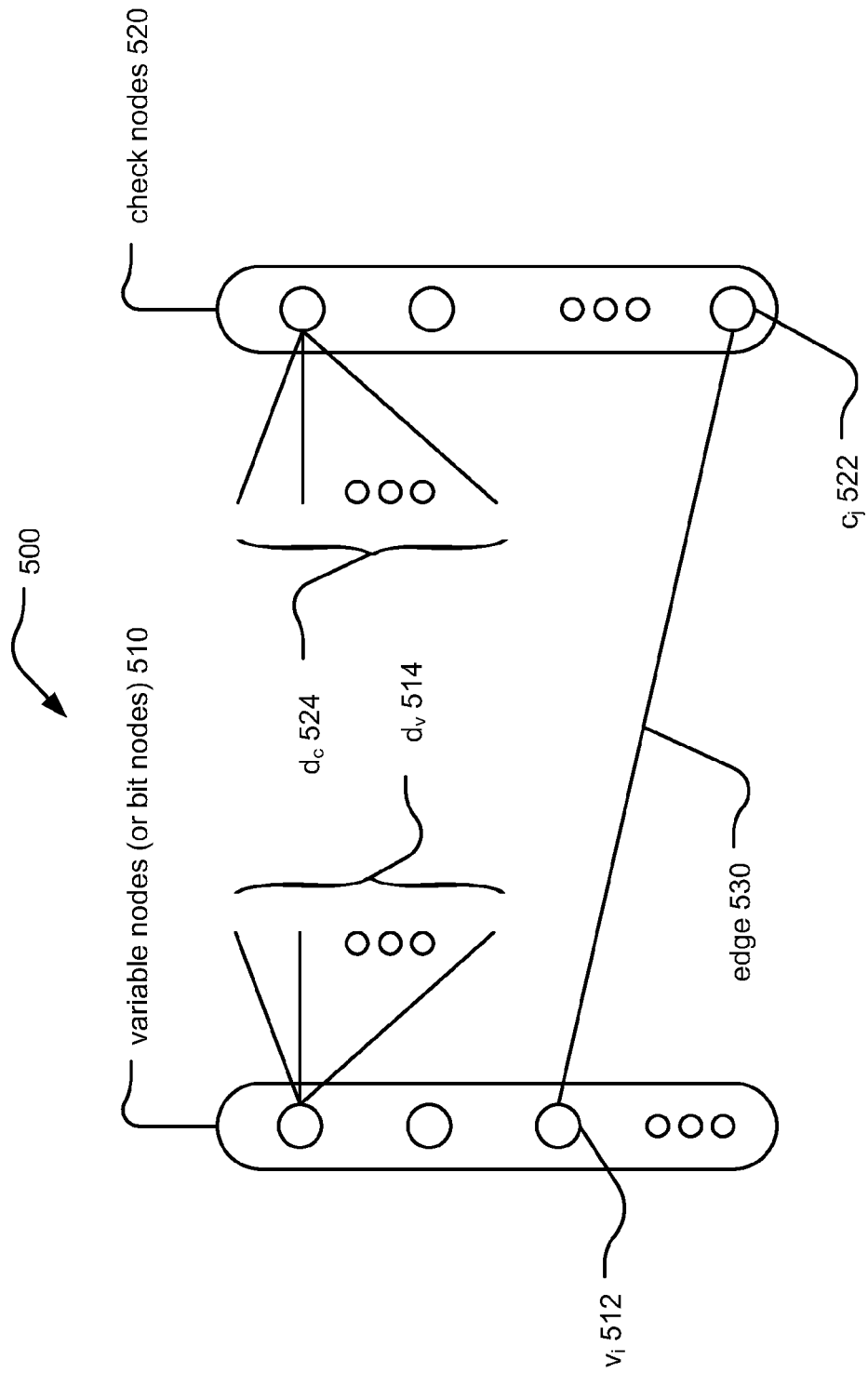
FIG. 5 illustrates an embodiment of an LDPC (Low Density Parity Check) code bipartite graph.

FIG. 5 illustrates an embodiment of an LDPC (Low Density Parity Check) code bipartite graph 500. In the art, an LDPC bipartite graph may also sometimes be referred to as a "Tanner" graph. An LDPC code may be viewed as being a code having a binary parity check matrix such that nearly all of the elements of the matrix have values of zeroes (e.g., the binary parity check matrix is sparse). For example, $H = (h_{i,j})_{M \times N}$ may be viewed as being a parity check matrix of an LDPC code with block length N.

LDPC codes are linear block codes and hence the set of all codewords $x \in C$ spans the null space of a parity check matrix, H.

$$Hx^T = 0, \forall x \in C \quad (1)$$

For LDPC codes, H, is a sparse binary matrix of dimension m×n. Each row of H corresponds to a parity check and a set element $h_{ij}$ indicates that data symbol j participates in parity check i. Each column of H corresponds to a codeword symbol.

For each codeword x there are n symbols of which m are parity symbols. Hence the code rate r is given by:

$$r = (n-m)/n \quad (2)$$

The row and column weights are defined as the number of set elements in a given row or column of H, respectively. The set elements of H are chosen to satisfy the performance requirements of the code. The number of 1's in the i-th column of the parity check matrix, H, may be denoted as $d_v(i)$, and the number of 1's in the j-th row of the parity check matrix may be denoted as $d_c(j)$. If $d_v(i) = d_v$ for all i, and $d_c(j) = d_c$ for all j, then the LDPC code is called a $(d_v, d_c)$ regular LDPC code, otherwise the LDPC code is called an irregular LDPC code.

LDPC codes were introduced by R. Gallager in [1] referenced below (also in [2] referenced below) and by M. Luby et al. in [3] also referenced below.

[1] R. Gallager, *Low-Density Parity-Check Codes*, Cambridge, Mass.: MIT Press, 1963.

[2] R. G. Gallager, "Low density parity check codes," *IRE Trans. Info. Theory*, vol. IT-8, January 1962, pp. 21-28.

[3] M. G. Luby, M. Mitzenmacher, M. A. Shokrollahi, D. A. Spielman, and V. Stemann, "Practical Loss-Resilient Codes", *Proc. 29th Symp. on Theory of Computing,* 1997, pp. 150-159.

A regular LDPC code can be represented as a bipartite graph 500 by its parity check matrix with left side nodes representing variable of the code bits (or alternatively as the "variable nodes" (or "bit nodes") 510 in a bit decoding approach to decoding LDPC coded signals), and the right side nodes representing check equations (or alternatively as the "check nodes" 520). The bipartite graph 500 (or sometimes referred to as a Tanner graph 500) of the LDPC code defined by H may be defined by N variable nodes (e.g., N bit nodes) and M check nodes. Every variable node of the N variable nodes 510 has exactly $d_v(i)$ edges (an example edge shown using reference numeral 530) connecting the bit node, $v_i$ 512, to one or more of the check nodes (within the M check nodes). The edge 530 is specifically shown as connecting from the bit node, $v_i$ 512, to the check node, $c_j$ 522. This number of $d_v$ edges (shown as $d_v$ 514) may be referred to as the degree of a variable node i. Analogously, every check node of the M check nodes 520 has exactly $d_c(j)$ edges (shown as $d_c$ 524) connecting this node to one or more of the variable nodes (or bit nodes) 510. This number of edges, $d_c$, may be referred to as the degree of the check node j.

An edge 530 between a variable node $v_i$ (or bit node $b_i$) 512 and check node $c_j$ 522 may be defined by e=(i, j). However, on the other hand, given an edge e=(i, j), the nodes of the edge may alternatively be denoted as by e=(v(e),c(e)) (or e=(b(e), c(e))). Alternatively, the edges in the graph correspond to the set elements of H where a set element $h_{j,i}$ indicates that an edge connects a bit (e.g., variable) node i with parity check node j.

Given a variable node $v_i$ (or bit node $b_i$), one may define the set of edges emitting from the node $v_i$ (or bit node $b_i$) by $E_v$ (i)={e|v(e)=i} (or by $E_b$ (i)={e|b(e)=i}); these edges are referred to as bit edges, and the messages corresponding to these bit edges are referred to as bit edge messages.

Given a check node $c_j$, one may define the set of edges emitting from the node $c_j$ by $E_c$ (j)={e|c(e)=j}; these edges are referred to as check edges, and the messages corresponding to these check edges are referred to as check edge messages. Continuing on, the derivative result will be $|E_v(i)|=d_v$ (or $|E_b(i)|=d_b$) and $|E_c(j)|=d_c$.

Generally speaking, any codes that can be represented by a bipartite graph may be characterized as a graph code. It is also noted that an irregular LDPC code may also described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Luby et al. in [3] referenced above.

In general, with a graph of an LDPC code, the parameters of an LDPC code can be defined by a degree of distribution, as described within M. Luby et al. in [3] referenced above and also within the following reference [4]:

[4] T. J. Richardson and R. L. Urbanke, "The capacity of low-density parity-check code under message-passing decoding," *IEEE Trans. Inform. Theory*, Vol. 47, No. 2, February 2001, pp. 599-618.

This distribution may be described as follows:

Let $\lambda_i$ represent the fraction of edges emanating from variable nodes of degree i and let $\rho_i$ represent the fraction of edges emanating from check nodes of degree i. Then, a degree distribution pair $(\lambda, \rho)$ is defined as follows:

$$\lambda(x) = \sum_{i=2}^{M_v} \lambda_i x^{i-1} \text{ and } \rho(x) = \sum_{i=2}^{M_c} \rho_i x^{i-1},$$

where $M_v$ and $M_c$ represent the maximal degrees for variable nodes and check nodes, respectively.

While many of the illustrative embodiments described herein utilize regular LDPC code examples, it is noted that certain aspects and/or embodiments of the invention are also operable to accommodate both regular LDPC codes and irregular LDPC codes.

It is also noted that many of the embodiments described herein employ the terminology of "bit node" and "bit edge message", or equivalents thereof. Oftentimes, in the art of LDPC decoding, the "bit node" and "bit edge message" are alternatively referred to as "variable node" and "variable edge message", in that, the bit values (or variable values) are those which are attempted to be estimated. Either terminology can be employed in accordance with certain aspects of the invention.

Figure 6:
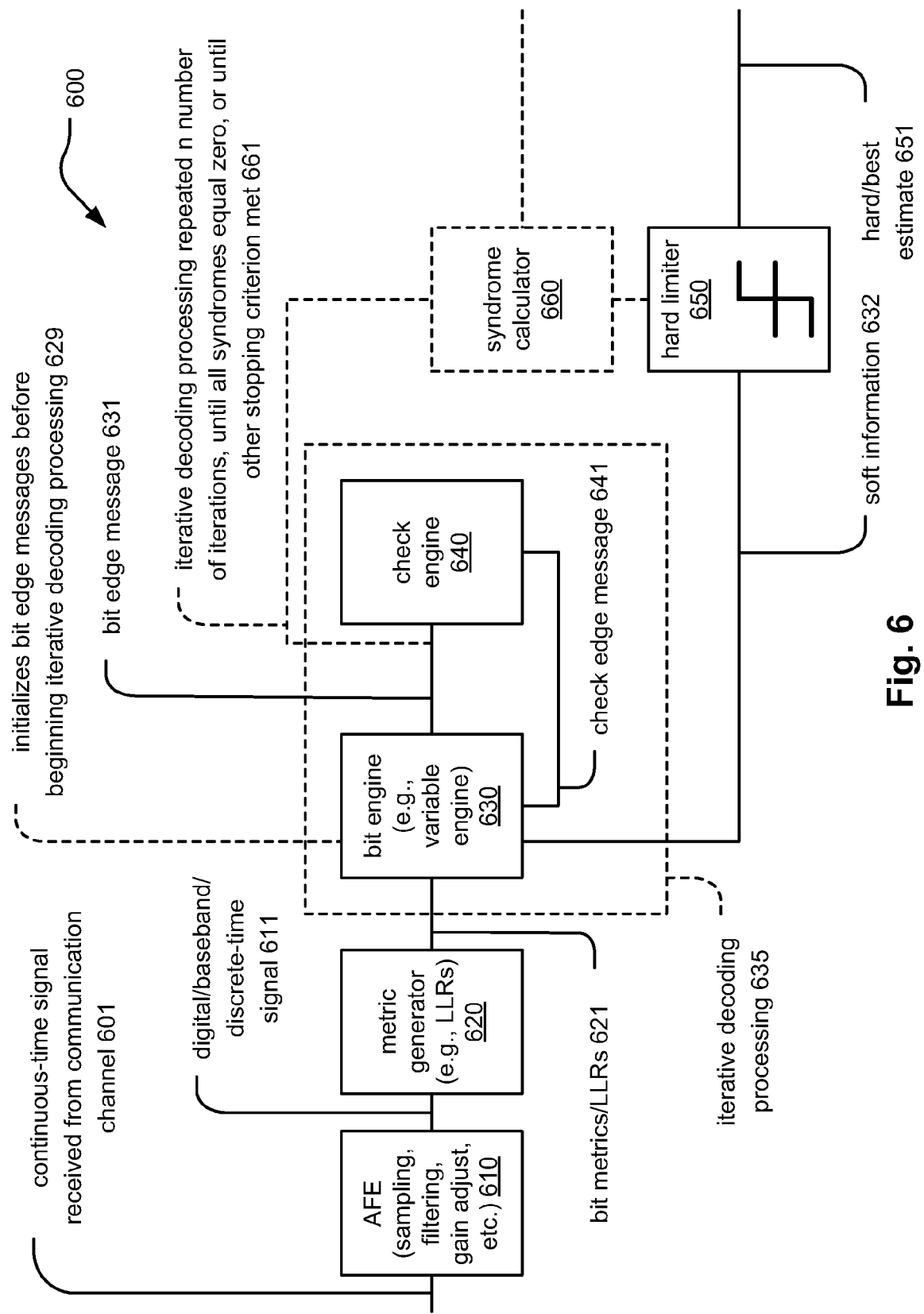
FIG. 6 illustrates an embodiment of LDPC decoding functionality.

FIG. 6 illustrates an embodiment of LDPC decoding functionality 600. To perform decoding of an LDPC coded signal having an m-bit signal sequence, the functionality of this diagram may be employed. Generally speaking, a continuous-time signal is received from a communication channel, as shown by reference numeral 601. The communication channel can be any type of channel including, though not limited to, a wireline communication channel, a wireless communication channel, a fiber-optic communication channel, a read channel of a HDD, or other type of communication channel capable to carrying a continuous-time signal that has been coded using an LDPC code.

An analog front-end (AFE) 610 is operable to perform any initial processing on the continuous-time signal (e.g., by performing any one or more of filtering (analog and/or digital filtering), gain adjustment, etc.) and digital sampling thereby a discrete-time signal 611. This discrete-time signal 611 can alternatively be referred to as a digital signal, a baseband signal, or other appropriate terminology known in the art. Oftentimes, the discrete-time signal 611 is partitioned into I, Q (In-phase, Quadrature) values of the signal.

A metric generator 620 is operable to receive the discrete-time signal 611 (e.g., which can include the I, Q values thereof) and to calculate the corresponding bit metrics and/or log likelihood ratios (LLRs) 621 that correspond to the received values within the discrete-time signal 611. In some embodiments, the calculation of these bit metrics/LLRs symbol metrics 621 is a two-step process, in which, the metric generator 620 firstly is operable to calculate symbol metrics corresponding to the symbols of the discrete-time signal 611, an then the metric generator secondly is operable to employ the symbol metrics to decompose those symbol metrics into the bit metrics/LLRs 621. These bit metrics/LLRs 621 are then employed by a bit engine 630 to initialize the bit edge messages (e.g., as shown by reference numeral 629) that are employed when performing iterative decoding processing 635 (e.g., as performed by the bit engine 630 and a check engine 640) of the LDPC coded signal.

The initialization of the bit edge messages for each variable node i with the value of the log-likelihood ratio (LLR), $\lambda_i$, of the corresponding received symbol, $y_i$, defined as follows:

$$\lambda_i = \ln\left[\frac{Pr(x_i = 0 \mid y_i)}{Pr(x_i = 1 \mid y_i)}\right] \quad (3)$$

Also, at the bit nodes, a bit engine 630 is operable to compute the corresponding soft information of the bits (e.g., shown as soft information 632) using the most recently updated bit edge messages. However, it is common for multiple decoding iterations to be performed, so the initialized bit edge messages are passed to the check engine 640 where, during a first decoding iteration, the check engine 640 is operable to employ the initialized bit edge messages to update check edge messages.

At each check node, the LDPC decoding processing forms a parity check result (XOR) on the sign of the incoming messages. This operates by finding the sign of each outgoing message as the XOR of the sign of the corresponding incoming message with the parity check result.

The decoding processing then calculates the outgoing message reliability from check node j to the bit (e.g., variable) node i according to:

$$\lambda_{ji} = 2 \tanh^{-1}\left(\prod_{k, h_{jk}=1, k \neq i} \tanh\left(\frac{\lambda_{jk}}{2}\right)\right) \quad (4)$$

In some desired embodiments, this calculation is performed in the log domain to transform the multiplication into a sum as follows:

$$\lambda_{ji} = 2 \tanh^{-1}\left(\exp\left\{\sum_{k, h_{jk}=1, k \neq i} \log\left(\tanh\left(\frac{\lambda_{jk}}{2}\right)\right)\right\}\right) \quad (5)$$

Thereafter, the bit engine 630 is operable to receive the updated edge messages (e.g., shown as check edge message 641) from the check engine 640 and to employ them to update the bit edge messages. Also, the bit engine 630 is operable to employ the bit metrics/LLRs 621 that are received from the metric generator 620 when performing the updating of the bit edge messages in accordance with LDPC decoding. Also, these updated check edge messages 641 are then passed back to the bit nodes (e.g., to the bit engine 630) where the soft information 632 of the bits is calculated using the bit metrics/LLRs 621 and the current iteration values of the check edge messages. At each bit (e.g., variable) node, the calculation of the soft information involves forming the sum of the LLR of the received symbol with the incoming messages from the check node (e.g., the check edge messages 641). The decoded bit $\hat{x}_i$ given by the sign of the summation. Each outgoing message for the next decoder iteration is computed by subtracting the corresponding incoming message from the summation. To continue with the iterative decoding processing 635, these bit edge messages 631, after being updated, are then passed to the check engine 640.

Another decoding iteration can be performed, in that, at the check nodes, the check engine 640 is then operable to receive these updated bit edge messages 631 sent from the bit nodes (e.g., from the bit engine 630) and updates the check edge messages accordingly. These updated check edge messages 641 are then passed back to the bit nodes (e.g., to the bit engine 630) where the soft information 632 of the bits is calculated using the bit metrics/LLRs 621 and the current iteration values of the check edge messages. Thereafter, using this just calculated soft information 632 of the bits, the bit engine 630 again is operable to update the bit edge messages using the previous values of the check edge messages (from the just previous iteration). The iterative processing 635 continues between the bit nodes and the check nodes according to the LDPC code bipartite graph that was employed to encode the signal that is being decoded.

These iterative decoding processing steps, performed by the bit node engine 630 and the check node engine 640, are repeated until a stopping criterion is met as shown by reference numeral 661 (e.g., after a predetermined or adaptively determined number of iterations have been performed, after all syndromes of the LDPC code are all equal to zero (e.g., all of the parity checks are satisfied), and/or other stopping criterion has been met). Another possible means by which LDPC decoding can be stopped is when the current estimate of the LDPC codeword, $\hat{x}$, satisfies the following relationship:

$$H\hat{x}^T = 0$$

Soft information 632 can be generated within the bit engine 630 during each of the decoding iterations. In this embodiment, this soft information 632 may be provided to a hard limiter 650 where hard decisions may be made, and that hard information (e.g., hard/best estimate 651) may be provided to a syndrome calculator 660 that is operable to determine whether the syndromes of the LDPC code are all equal to zero. That is to say, the syndrome calculator 660 is operable to determine whether each syndrome associated with the LDPC code is equal to zero, based on the current estimate of the LDPC codeword.

When the syndromes are not equal to zero, the iterative decoding processing 635 can continue again by appropriately updating and passing the bit edge messages and the check edge messages between the bit engine 630 and the check engine 640, respectively. After all of these iterative decoding processing steps have been performed, then the hard/best estimates 651 of the bits are output based on the soft information 632.

Also, it is noted that for good decoding performance, it is important that the lengths of cycles in the graph are as long as possible. Short cycles, such as the length 4 cycle, can possibly degrade the performance of the message passing decoding approach to decoding an LDPC coded signal.

While the mathematics of the message passing decoding approach contains hyperbolic and logarithmic functions (e.g., see equation (5) above), in a hardware implementation these functions can alternatively be approximated by look-up tables (LUTs) or directly instantiated in logic gates. The arithmetic computation involves only additions, subtractions, and XOR operations. The number of bits required in fixed point implementation is determined by the required coding performance, speed of decoder convergence, and whether an error floor must be suppressed as described in reference [5].

[5] Zhang, T., Wang, Z., and Parhi, K., "On finite precision implementation of low density parity check codes decoder," *Proceedings of ISCAS*, Sydney, Australia, May 2001, pp 202-205.

Figure 7:
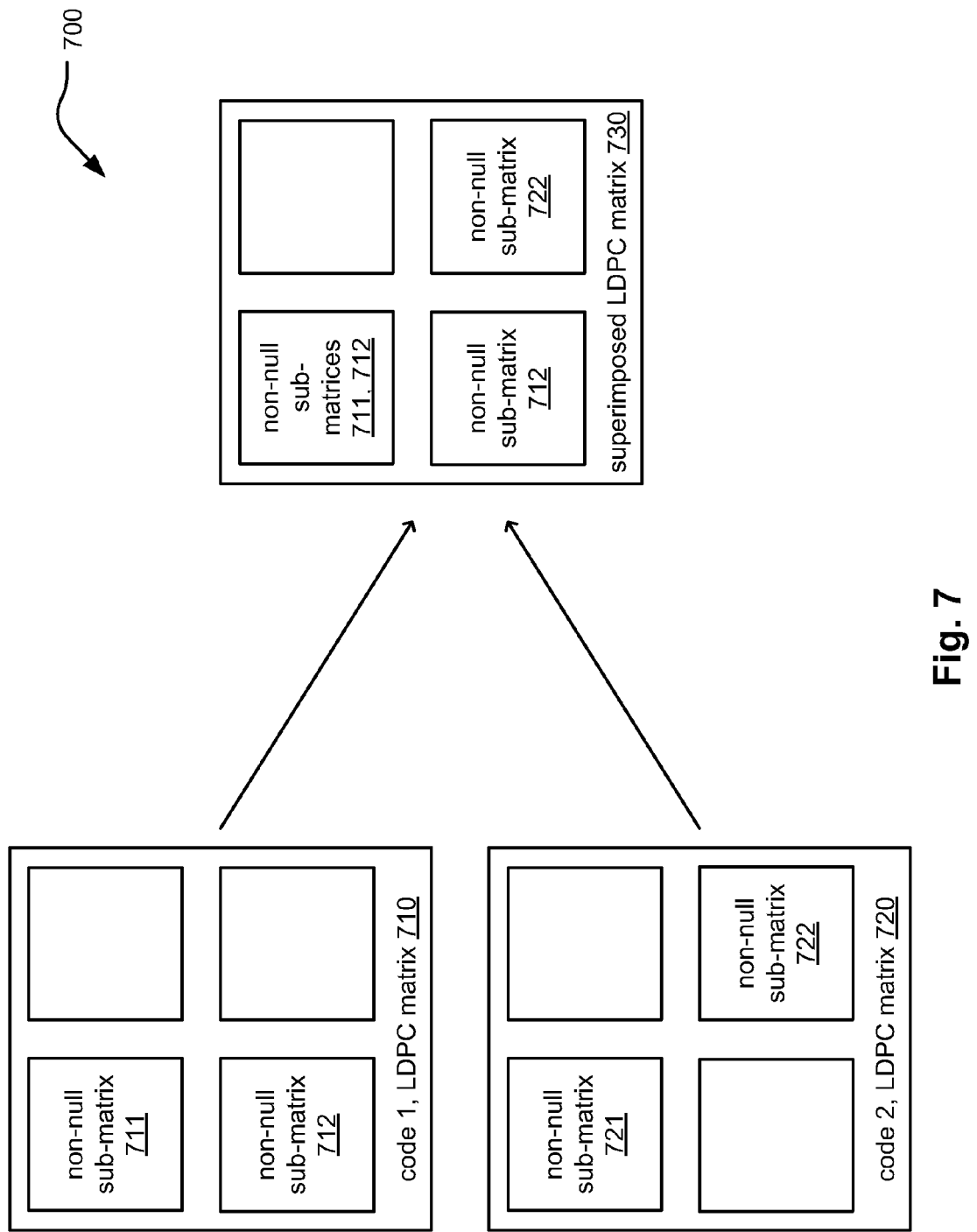
FIG. 7 illustrates an embodiment of superposition of non-null sub-matrices of multiple LDPC matrices.

FIG. 7 illustrates an embodiment 700 of superposition of non-null sub-matrices of multiple LDPC matrices. This embodiment 700 depicts two separate LDPC matrices corresponding to 2 separate LDPC codes (code 1, LDPC matrix 710 and code 2, LDPC matrix 720). Each of these particular LDPC matrices 710 and 720 include 4 sub-matrices, 2 of which are null sub-matrices and 2 of which are non-null sub-matrices (e.g., that include more than 1 non-null entry therein).

The code 1, LDPC matrix 710 includes non-null sub-matrix 711 and non-null sub-matrix 712; the code 2, LDPC matrix 720 includes non-null sub-matrix 721 and non-null sub-matrix 722. Each of these LDPC matrices 710 and 720, when superimposed generate the superimposed LDPC matrix 730. As can be seen, the non-null sub-matrix 711 and the non-null sub-matrix 712 occupy the same location within the superimposed LDPC matrix 730. In this example, there remains only one null sub-matrix within the superimposed LDPC matrix 730.

Figure 8:
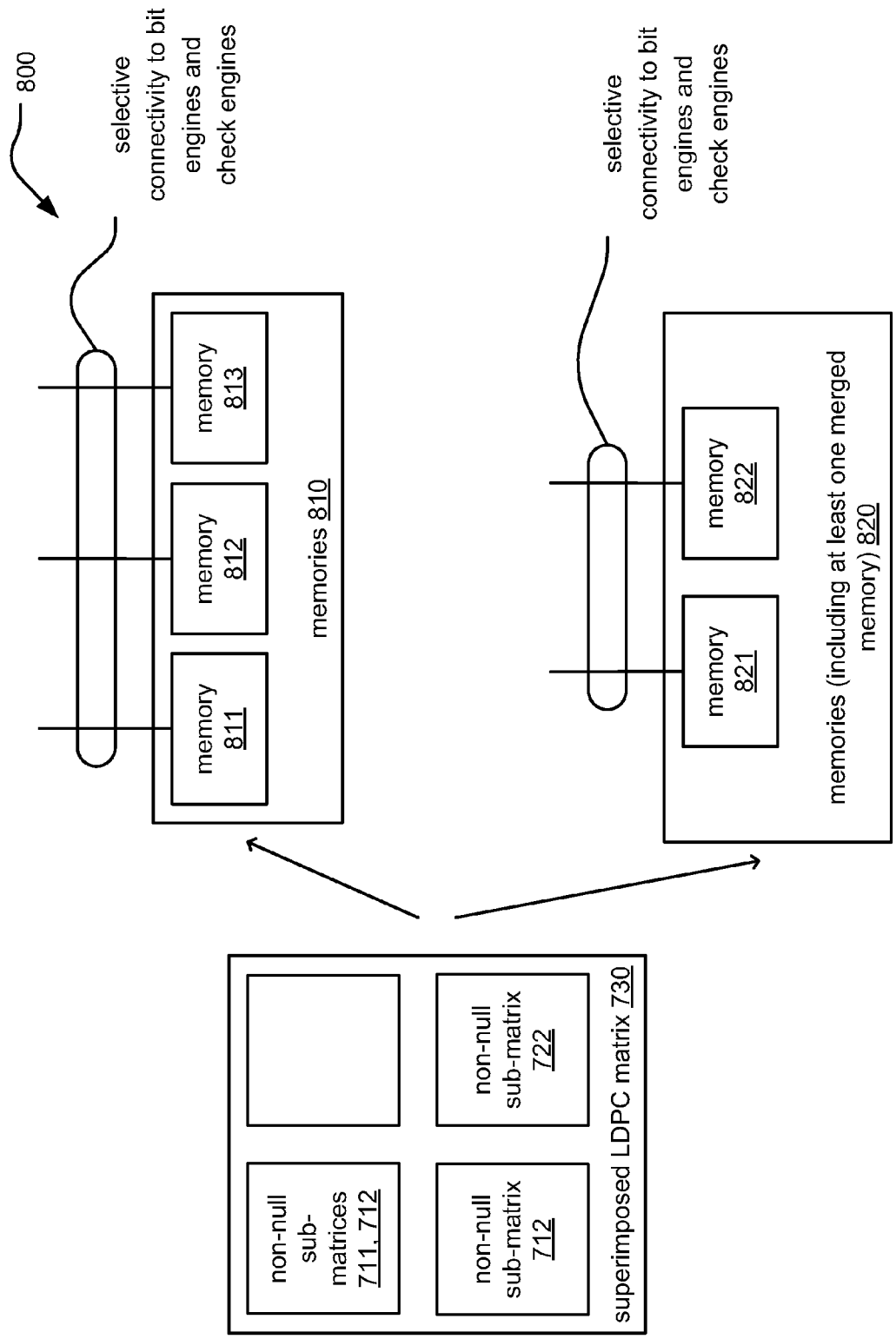
FIG. 8 illustrates an embodiment of provisioning of memories to accommodate processing of non-null sub-matrices of a superimposed LDPC matrix from FIG. 7.

FIG. 8 illustrates an embodiment 800 of provisioning of memories to accommodate processing of non-null sub-matrices of the superimposed LDPC matrix 730 from FIG. 7. A singular architecture that is operable to perform decoding of each LDPC code represented within the superimposed LDPC matrix 730 can be employed using three memories 810 (shown as including memory 811, memory 812, and memory 813) or two memories 820 (shown as including memory 821 and memory 822). In whichever embodiment, each of the memories can be selectively connected to bit engines and check engines for performing bit node processing and check node processing for updating of bit edge messages and check edge messages, respectively.

Figure 9:
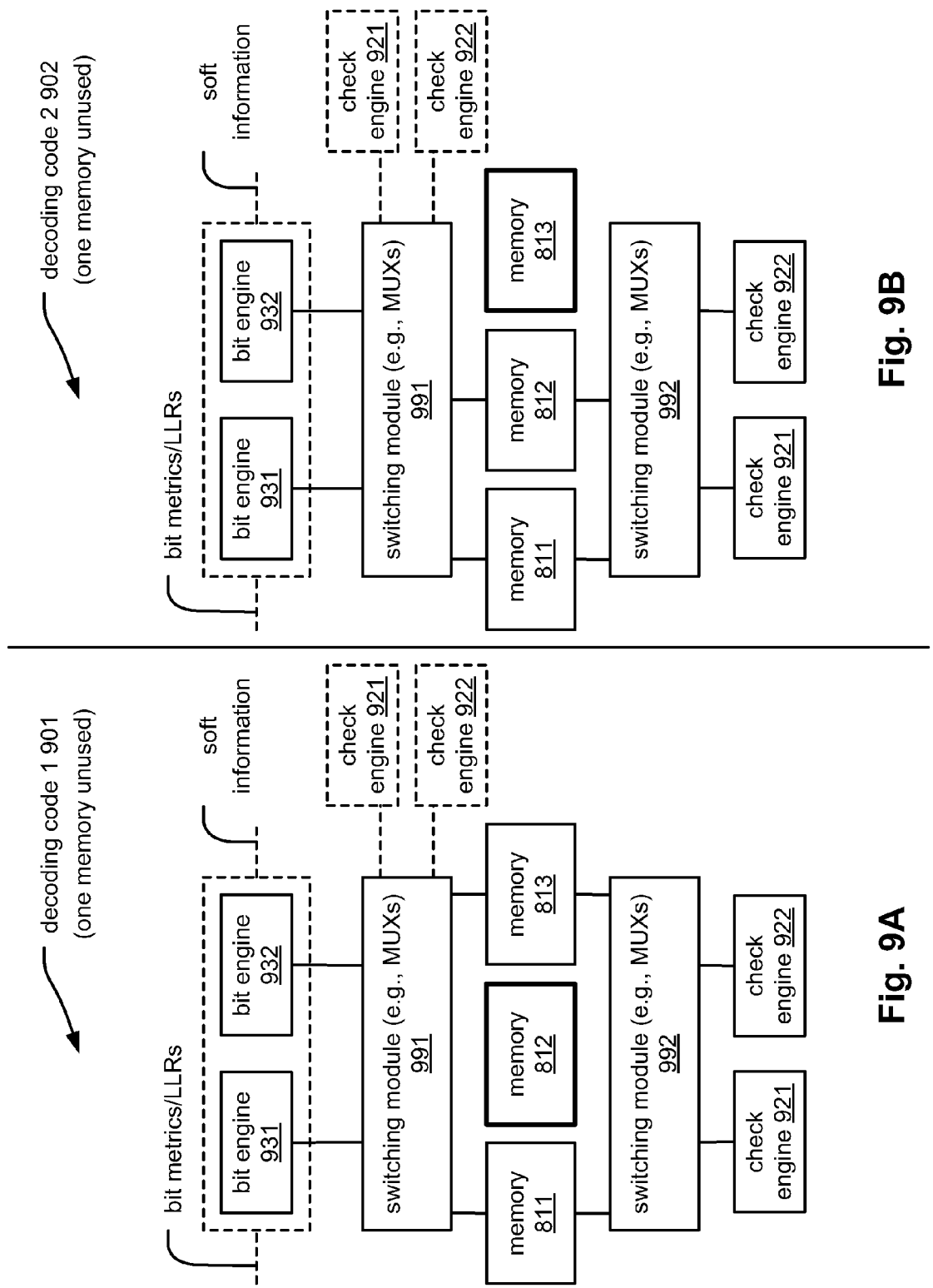
FIG. 9A and FIG. 9B illustrate embodiments of decoding architectures to accommodate processing of non-null sub-matrices of the superimposed LDPC matrix from FIG. 7.

FIG. 9A and FIG. 9B illustrate embodiments 901 and 902 of decoding architectures to accommodate processing of non-null sub-matrices of the superimposed LDPC matrix 730 from FIG. 7.

Referring to FIG. 9A, this embodiment includes three memories (i.e., memory 811, memory 812, and memory 813). Bit metrics/LLRs are provided to a plurality of bit engines (e.g., bit engine 931 and bit engine 932). A switching module 991 is implemented between bit engines 931-932 and the memories 811-813. Another switching module 992 is implemented between check engines 921-922 and the memories 811-813.

It is noted that the switching module 991 (as well as other switching modules described and depicted herein) can be implemented using a multiplexer (MUX) having multiple inputs/outputs, a plurality of MUXs, or any other number of desired means that allow selectivity between memories and bit engines and those memories and check engines.

When decoding the LDPC code 1, one memory is unused (e.g., memory 812 in this diagram), and the memory 811 is employed to process the sub-matrix 711, and the memory 813 is employed to process the sub-matrix 712, or vice versa.

Alternatively, a singular switching module can be employed (e.g., as depicted by the variant of the check engines 921-922 being also coupled to the switching module 991).

After the appropriate bit node processing and check node processing has been performed and when a stopping criterion has been met, then the bit engines 931-932 operate to generate soft information from which best estimates can be made for bits encoded within the LDPC coded signal encoded in accordance with code 1.

Referring to FIG. 9B, when decoding the LDPC code 2, again, one memory is unused (e.g., memory 813 in this diagram), and the memory 811 is employed to process the sub-matrix 721, and the memory 812 is employed to process the sub-matrix 722, or vice versa.

Again, in alternative embodiments, a singular switching module can be employed (e.g., as depicted by the variant of the check engines 921-922 being also coupled to the switching module 991).

After the appropriate bit node processing and check node processing has been performed and when a stopping criterion has been met, then the bit engines 931-932 operate to generate soft information from which best estimates can be made for bits encoded within the LDPC coded signal encoded in accordance with code 2.

These embodiments of FIG. 9A and FIG. 9B show a straightforward superposition approach in which 3 separate memories are employed. Below, LDPC coded signals encoded in accordance with the same 2 LDPC codes can be decoded using an architecture that employs only 2 memories.

Figure 10:
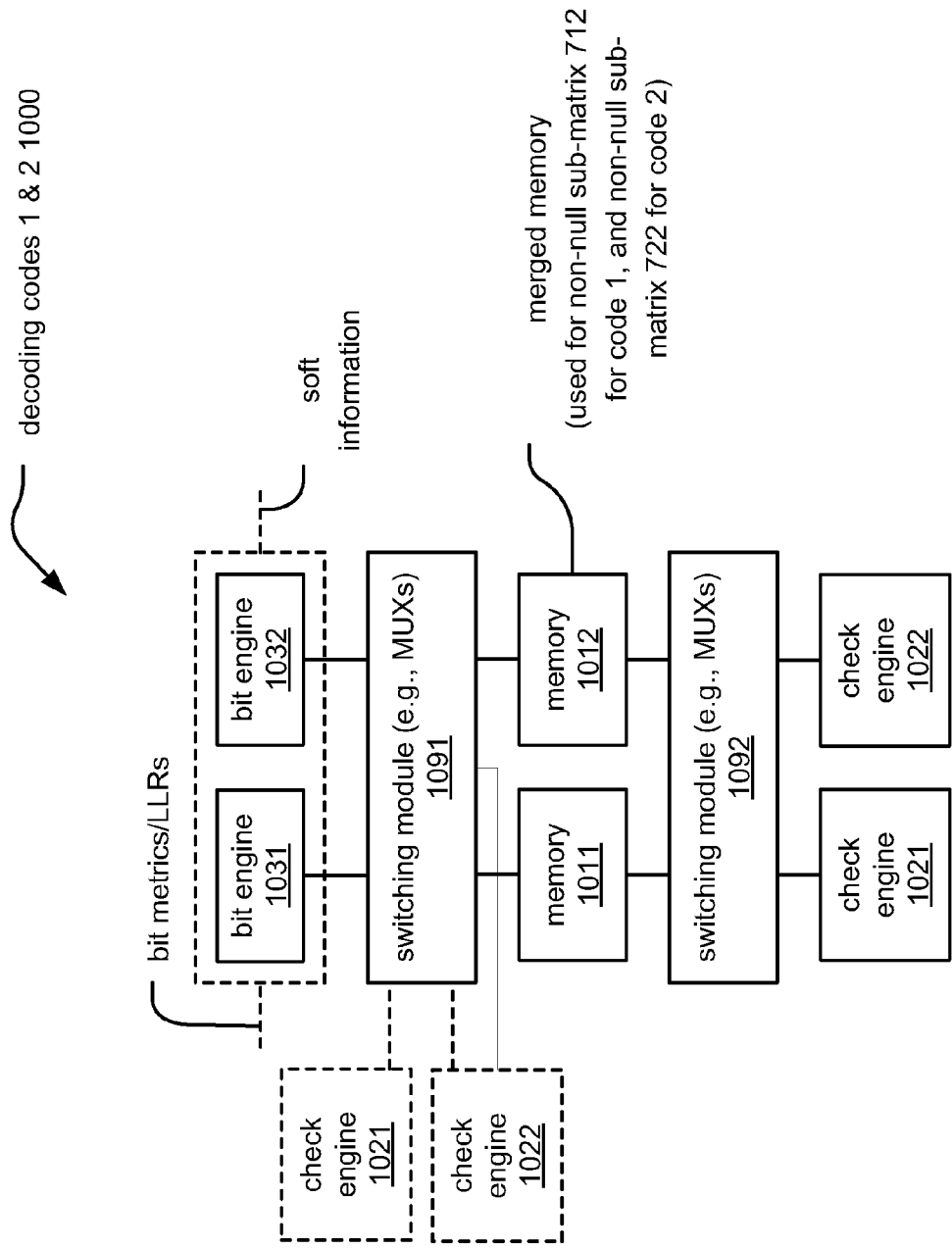
FIG. 10 illustrates an embodiment of a decoding architecture to accommodate processing of non-null sub-matrices of the superimposed LDPC matrix from FIG. 7.

FIG. 10 illustrates an embodiment of a decoding architecture to accommodate processing of non-null sub-matrices of the superimposed LDPC matrix 730 from FIG. 7. This embodiment shows how only 2 memories can be employed to perform decoding of the same LDPC matrices 710 and 720 as opposed to employing 3 memories. As can be seen the sub-matrix 712 (of LDPC matrix 710) and the sub-matrix 722 (of the LDPC matrix 720) do not occupy the same sub-matrix location within each of the LDPC matrices 710 and 720. These 2 sub-matrix locations are mutually exclusive in each of the LDPC matrices 710 and 720. Therefore, a singular memory can be employed (e.g., a merged memory) to effectuate decoding processing of the sub-matrix 712 when decoding a first LDPC coded signal encoded in accordance with LDPC code 1, and to effectuate decoding processing of the sub-matrix 722 when decoding a first LDPC coded signal encoded in accordance with LDPC code 2.

With respect to merging of memories, if a particular memory is employed by no LDPC codes, then clearly that memory would be eliminated. Therefore, memories need only be provisioned for those sub-matrices within a resulting, superimposed LDPC matrix that have non-null (e.g., non-zero) elements. Also, each memory therefore also has at least one non-null LDPC code in which it is active (e.g., employed to decode that LDPC code).

Again, as mentioned above, even greater efficiencies can be achieved by merging memory elements that correspond to mutually exclusive non-null sub-matrix. Those groups of memories with mutually exclusive sets of active codes can be merged into single memories. The more memories with mutually exclusive sets of active codes there are (and that can appropriately be identified), then the greater the degree of merging that can be achieved, and the greater the hardware savings (e.g., reduction in the number of memories employed).

Referring to FIG. 10, this embodiment includes only two memories (i.e., memory 1011 and memory 1012). Bit metrics/LLRs are provided to a plurality of bit engines (e.g., bit engine 1031 and bit engine 1032). A switching module 1091 is implemented between bit engines 1031-1032 and the memories 1011-1012. Another switching module 1092 can be implemented between check engines 1021-1022 and the memories 1011-1012.

As within other embodiments, it is noted that the switching module 991 (as well as other switching modules described and depicted herein) can be implemented using a multiplexer (MUX) having multiple inputs/outputs, a plurality of MUXs, or any other number of desired means that allow selectivity between memories and bit engines and those memories and check engines.

When decoding the LDPC code 1, both of the memories 1011-1012 are employed. The memory 1011 is employed to process the sub-matrix 711, and the memory 1012 is employed to process the sub-matrix 712, or vice versa.

After the appropriate bit node processing and check node processing has been performed and when a stopping criterion has been met, then the bit engines 1031-1032 operate to generate soft information from which best estimates can be made for bits encoded within the LDPC coded signal encoded in accordance with code 1.

When decoding the LDPC code 2, again, both of the memories 1011-1012 are employed. The memory 1011 is employed to process the sub-matrix 721, and the memory 1012 is employed to process the sub-matrix 722, or vice versa.

After the appropriate bit node processing and check node processing has been performed and when a stopping criterion has been met, then the bit engines 1031-1032 operate to generate soft information from which best estimates can be made for bits encoded within the LDPC coded signal encoded in accordance with code 2.

Alternatively, as within other embodiments, a singular switching module can be employed (e.g., as depicted by the variant of the check engines 1021-1022 being also coupled to the switching module 1091).

As can be seen in this diagram, a merger memory (e.g., depicted as memory 1012 in this diagram) can be employed to perform processing for non-null sub-matrix 712 for code 1 and to perform processing for non-null sub-matrix 722 for code 2). This principle of employing merged memories to perform decoding processing of mutually exclusive non-null sub-matrices can be extended to larger LDPC matrices as well.

Figure 11:
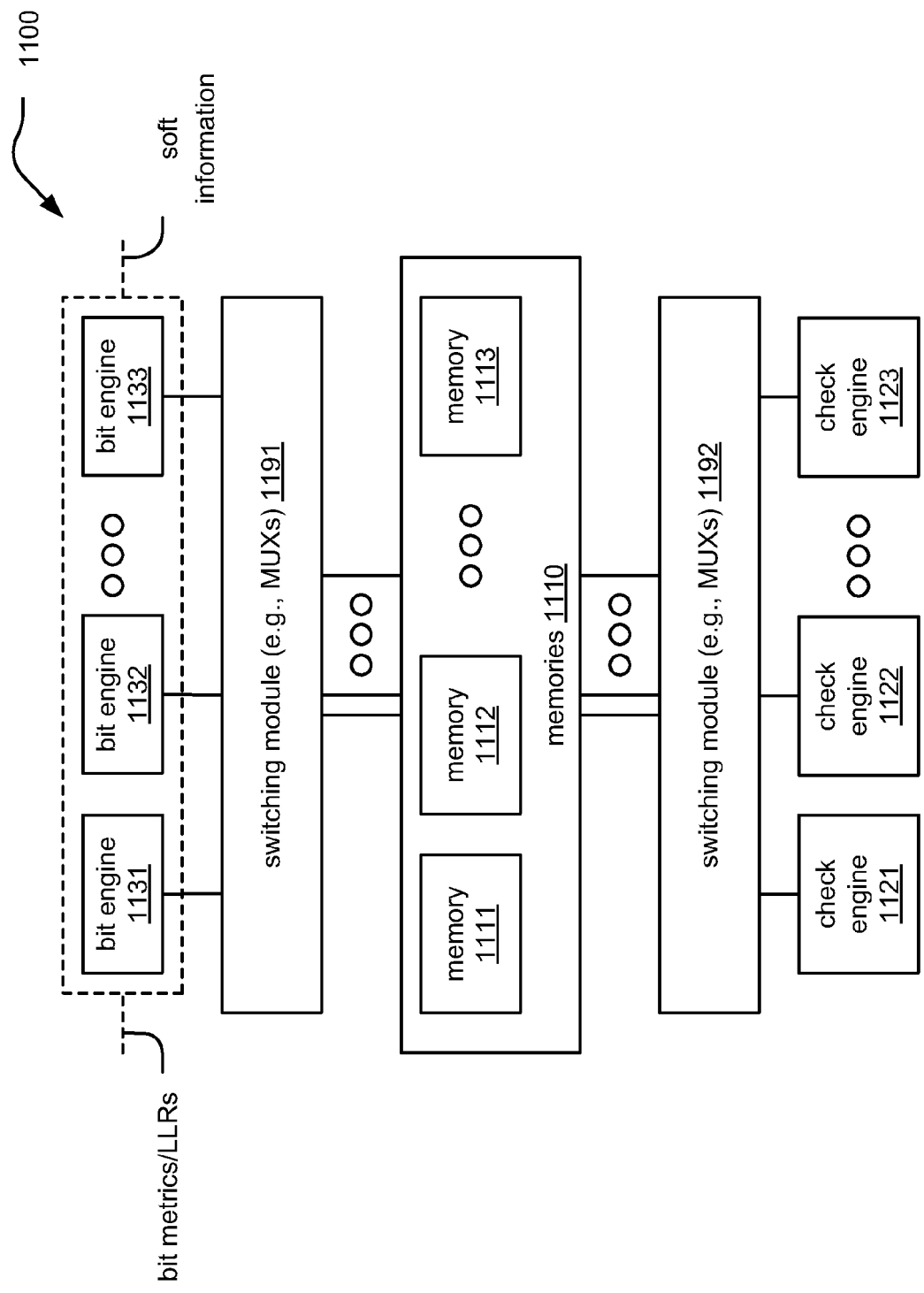
FIG. 11 illustrates an embodiment of a decoding architecture to accommodate processing of non-null sub-matrices of a superimposed LDPC matrix.

FIG. 11 illustrates an embodiment 1100 of a decoding architecture to accommodate processing of non-null sub-matrices of a superimposed LDPC matrix. This embodiment can be generalized to accommodate decoding of coded signals having LDPC matrices of any desired size.

Referring to FIG. 11, this embodiment includes a plurality of memories 1110 (i.e., depicted by memory 1111-1113). Bit metrics/LLRs are provided to a plurality of bit engines (e.g., bit engine 1131-1133). A switching module 1191 is implemented between the plurality of bit engines 1131-1133 and the plurality of memories 1110. Another switching module 1192 is implemented between a plurality of check engines 1121-1122 and the plurality of memories 1110.

Again, as within other embodiments, it is noted that the switching module 1191 (as well as other switching modules described and depicted herein) can be implemented using a multiplexer (MUX) having multiple inputs/outputs, a plurality of MUXs, or any other number of desired means that allow selectivity between the plurality of memories 1110 and plurality of bit engines 1131-1133 and those memories 1110 and the plurality of check engines 1121-1123.

When decoding a first signal encoded in accordance with a first LDPC code, a first subset of the memories 1110 is employed to process the non-null sub-matrices within the LDPC matrix of the first LDPC code.

When decoding a second signal encoded in accordance with a second LDPC code, a second subset of the memories 1110 is employed to process the non-null sub-matrices within the LDPC matrix of the second LDPC code.

When decoding a third signal encoded in accordance with a third LDPC code, a third subset of the memories 1110 is employed to process the non-null sub-matrices within the LDPC matrix of the third LDPC code.

And so on . . .

In some embodiments, a same number of the plurality of memories 1110 are employed when decoding each coded signal. In alternative embodiments, a different number of memories can be employed when decoding different coded signal. For example, each of the first subset, the second subset, and the third subset described just above can include a same number of memories, or they can each include a different number of memories in various embodiments.

The switching modules 1191 and 1192 are operable to ensure the appropriate connectivity between the plurality of bit engines 1131-1133 and the plurality of memories 1110 for accessing check edge messages for use in performing updating of bit edge messages, and the switching modules 1191 and 1192 are operable to ensure the appropriate connectivity between the plurality of check engines 1121-1123 and the plurality of memories 1110 for accessing bit edge messages for use in performing updating of check edge messages.

After the appropriate bit node processing and check node processing has been performed and when a stopping criterion has been met, then the bit engines 1131-1132 operate to generate soft information from which best estimates can be made for bits encoded within the LDPC coded signal encoded in accordance with the particular LDPC code of interest.

Figure 12:
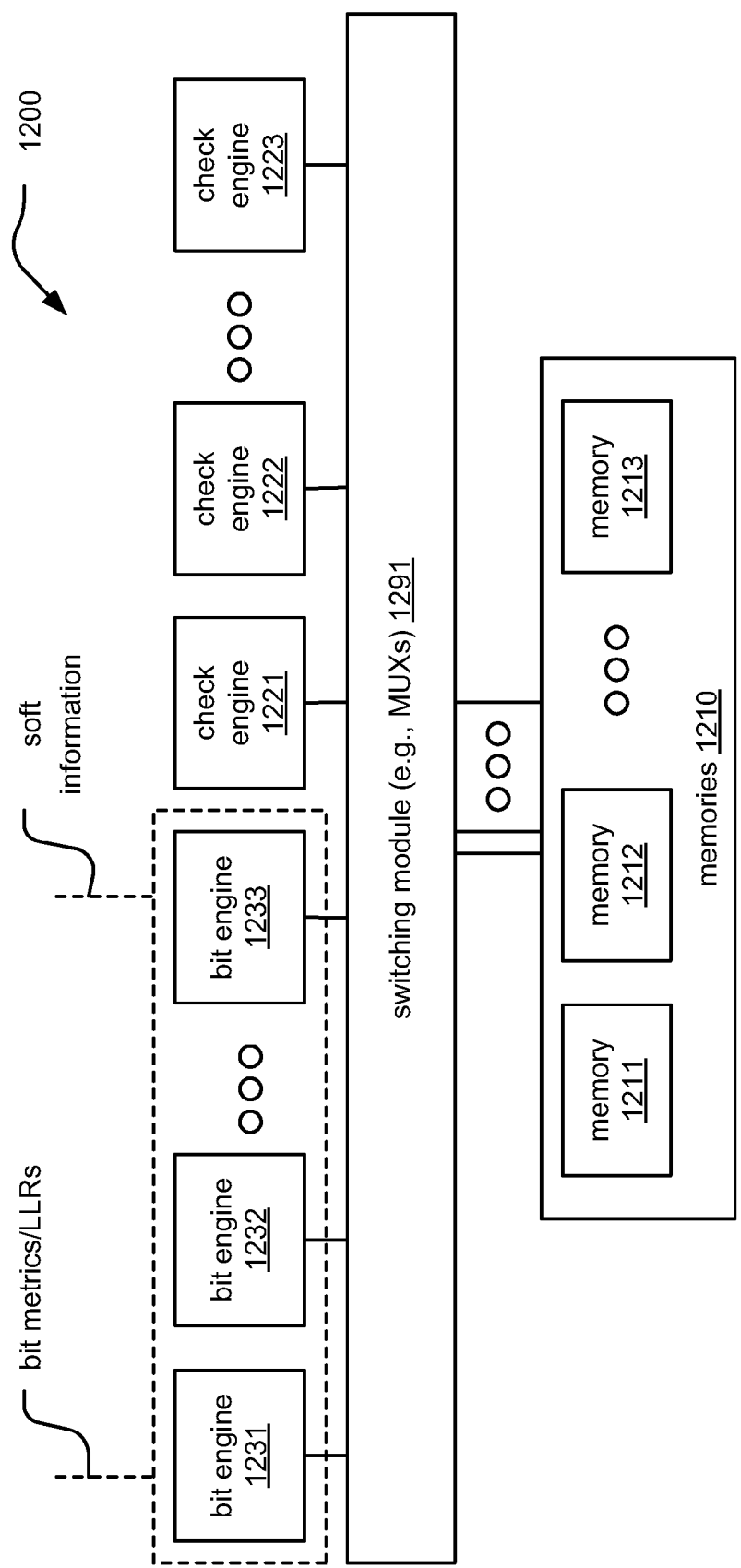
FIG. 12 illustrates an alternative embodiment of a decoding architecture to accommodate processing of non-null sub-matrices of a superimposed LDPC matrix.

FIG. 12 illustrates an alternative embodiment 1200 of a decoding architecture to accommodate processing of non-null sub-matrices of a superimposed LDPC matrix.

Referring to FIG. 12, this embodiment includes a plurality of memories 1210 (i.e., depicted by memory 1211-1213). Bit metrics/LLRs are provided to a plurality of bit engines (e.g., bit engine 1231-1233). A switching module 1291 is implemented between the plurality of bit engines 1231-1233 and the plurality of memories 1210. The very same switching module 1291 also provides for selective connectivity between a plurality of check engines 1221-1222 and the plurality of memories 1210.

When decoding a first signal encoded in accordance with a first LDPC code, a first subset of the memories 1210 is employed to process the non-null sub-matrices within the LDPC matrix of the first LDPC code.

When decoding a second signal encoded in accordance with a second LDPC code, a second subset of the memories 1210 is employed to process the non-null sub-matrices within the LDPC matrix of the second LDPC code.

When decoding a third signal encoded in accordance with a third LDPC code, a third subset of the memories 1210 is employed to process the non-null sub-matrices within the LDPC matrix of the third LDPC code.

And so on . . .

In some embodiments, a same number of the plurality of memories 1210 are employed when decoding each coded signal. In alternative embodiments, a different number of memories can be employed when decoding different coded signal. For example, each of the first subset, the second subset, and the third subset described just above can include a same number of memories, or they can each include a different number of memories in various embodiments.

The switching module 1291 is operable to ensure the appropriate connectivity between the plurality of bit engines 1231-1233 and the plurality of memories 1210 for accessing check edge messages for use in performing updating of bit edge messages, and the switching module 1291 is also operable to ensure the appropriate connectivity between the plurality of check engines 1221-1223 and the plurality of memories 1210 for accessing bit edge messages for use in performing updating of check edge messages.

After the appropriate bit node processing and check node processing has been performed and when a stopping criterion has been met, then the bit engines 1231-1232 operate to generate soft information from which best estimates can be made for bits encoded within the LDPC coded signal encoded in accordance with the particular LDPC code of interest.

FIG. 13 and FIG. 14 illustrate embodiments 1300 and 1400 of hardware provisioning for decoding non-null sub-matrices of a superimposed LDPC matrix.

Referring to FIG. 13, each of the LDPC coded signals decoded in accordance with this embodiment 1300 have a same number of non-null sub-matrices. The only difference in decoding each of the LDPC coded signals encoded in accordance with each of these LDPC codes is that different subsets of the memories employed for each coded signal may be different.

For example, when decoding signals encoded according to a code 1, the corresponding LDPC matrix includes 'X' non-null sub-matrices, all of the provisioned bit engines are employed for bit node processing, all of the provisioned check engines are employed for check node processing, a number 'X' memories of a total number of available 'Y' memories is employed, and a subset 1 of those 'Y' memories is employed.

When decoding signals encoded according to a code 2, the corresponding LDPC matrix includes 'X' non-null sub-matrices, all of the provisioned bit engines are employed for bit node processing, all of the provisioned check engines are employed for check node processing, a number 'X' memories of a total number of available 'Y' memories is employed, and a subset 2 of those 'Y' memories is employed.

And so on as depicted in the diagram . . .

As can be seen, the only difference is that different subsets of the memories are employed when decoding different LDPC coded signals in this embodiment 1300.

A same number of bit engines and a same number of check engines can be employed when decoding each of the each of the LDPC coded signals encoded in accordance with each of these LDPC codes in the FIG. 13.

Referring to FIG. 14, this embodiment 1400 depicts alternative embodiments by which various degrees of parallelism can be employed. This embodiment 1400 shows how a broader degree of variability and flexibility can be employed when decoding different LDPC coded signals.

For example, when decoding signals encoded according to a code a, the corresponding LDPC matrix includes 'a1' non-null sub-matrices, a subset a2 of a total number of 'M' provisioned bit engines are employed for bit node processing, a subset a3 of a total number of 'L' provisioned check engines are employed for check node processing, a number 'a2' or 'a3' memories of a total number of available 'Z' memories is employed, and a subset a4 of those 'Z' memories is employed.

When decoding signals encoded according to a code b, the corresponding LDPC matrix includes 'b2' non-null sub-matrices, a subset b2 of the total number of 'M' provisioned bit engines are employed for bit node processing, a subset b3 of the total number of 'L' provisioned check engines are employed for check node processing, a number 'b2' or 'b3' memories of a total number of available 'Z' memories is employed, and a subset b4 of those 'Z' memories is employed.

And so on as depicted in the diagram . . .

In this embodiment 1400, for example, each sub-iteration (e.g., bit node processing or check node processing) can be performed using multiple cycles. Looking at bit node processing in one example, a first half of the bit edge messages can be updated during a first time using a provisioned number of bit engines, and the second half of the bit edge messages can be updated using the provisioned number of bit engines during a second time. This can be viewed as being a semi-parallel bit node processing approach, in that, two separate steps are employed to perform a decoding sub-iteration (e.g., bit node processing).

As another example, looking at check node processing in another example, a first third of the check edge messages can be updated during a first time using a provisioned number of check engines, a second third of the check edge messages can be updated using the provisioned number of check engines during a second time, and the final third of the check edge messages can be updated using the provisioned number of check engines during a third time. This can be viewed as being a parallel check node processing approach, in that, three separate steps are employed to perform a decoding sub-iteration (e.g., check node processing).

Clearly, other variations can also be employed without departing from the scope and spirit of the invention, in that, the number of cycles employed for each sub-iteration can varied as desired in particular embodiments as well.

Again within this embodiment 1400, each LDPC matrix need not have the same number of non-null sub-matrices. Those memories corresponding to null sub-matrices for a particular LDPC matrix are disconnected when decoding a particular LDPC coded signal that does not require all of the provisioned memories. When a particular memory is unused during decoding of a particular signal, that memory can effectively be cut off (e.g., disconnected) from the rest of the circuitry to prevent the idle memory from corrupting active computation as well as for energy savings. This cutting off of the memory can be effectuated by setting an input to the memory to be 0 (or a maximum value "maxval") for each of the variable nodes and check nodes, respectively, associated with that particular unused sub-matrix that is a null sub-matrix for decoding that particular code.

Figure 15:
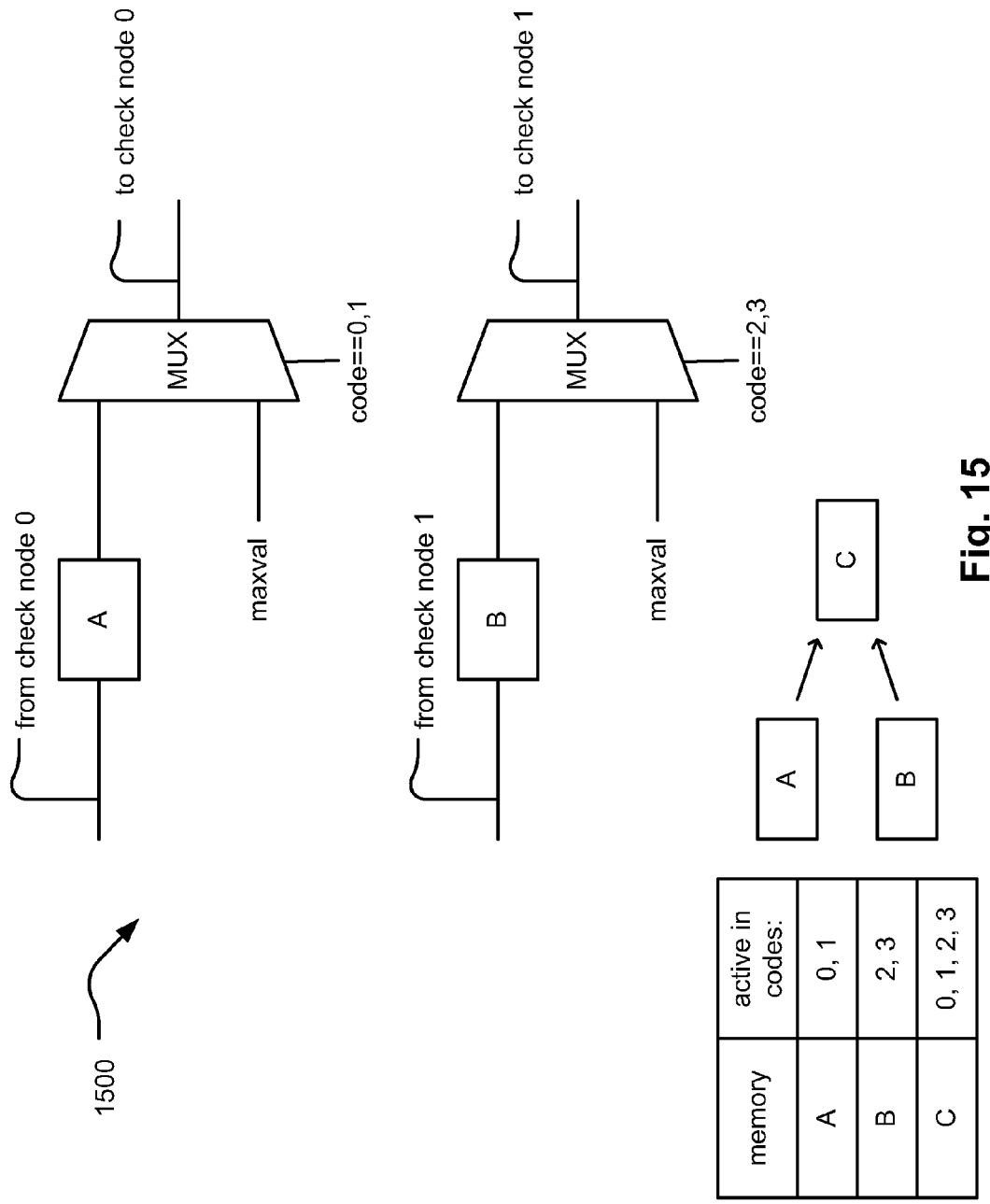
FIG. 15 illustrates an embodiment of connectivity between 2 mutually exclusive provisioned memories employed for check node processing in accordance with LDPC decoding processing.
Figure 16:
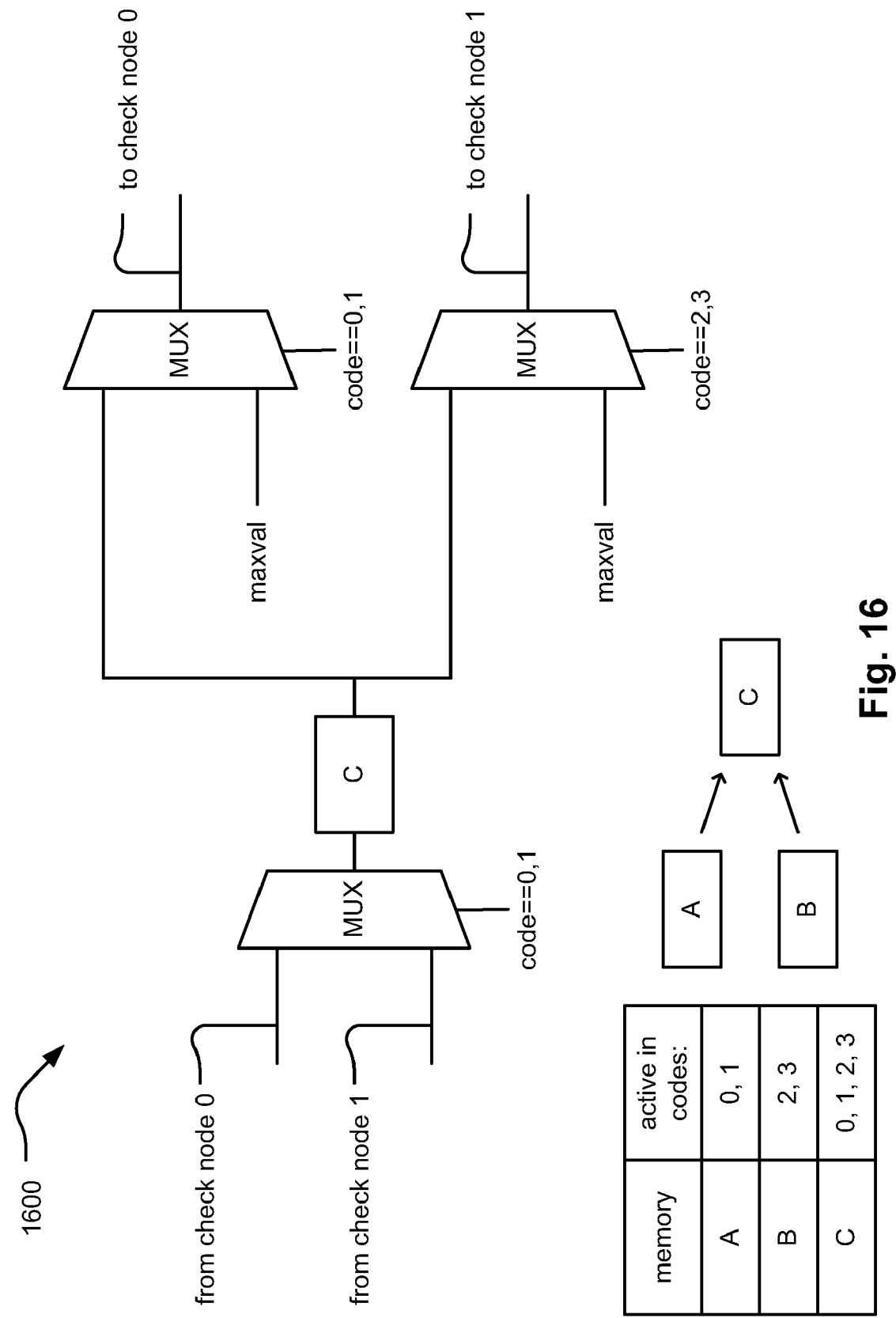
FIG. 16 illustrates an embodiment of connectivity of a merged memory employed for check node processing in accordance with LDPC decoding processing.

FIG. 15 and FIG. 16 depict embodiments that employ at least one merge memory. In these embodiments, there is memory sharing as follows:

Memory A is active when decoding signals encoded in accordance with code 0 and code 1, and is idle when decoding signals encoded to all other codes.

Memory B is active when decoding signals encoded in accordance with code 2 and code 3, and is idle when decoding signals encoded to all other codes.

FIG. 15 illustrates an embodiment 1500 of connectivity between 2 mutually exclusive provisioned memories employed for check node processing in accordance with LDPC decoding processing. This embodiment depicts how the memory A can be employed when decoding signals encoded in accordance with code 0 and code 1, and can be effectively disconnected (e.g., cut off) from the hardware when decoding signals encoded to all other codes. When the memory A is unused during decoding of certain signals, the memory A is effectively cut off (e.g., disconnected) from the rest of the hardware/circuitry to prevent the idle memory A from corrupting active computation as well as for energy savings. This cutting off of the memory can be effectuated by setting an input to the memory to be 0 (or a maximum value "maxval" using a MUX) for each of the variable nodes and check nodes, respectively, associated with that particular unused sub-matrix that is a null sub-matrix for decoding that particular code.

This embodiment also depicts how the memory B can be employed when decoding signals encoded in accordance with code 2 and code 3, and can be effectively disconnected (e.g., cut off) from the hardware when decoding signals encoded to all other codes. When the memory B is unused during decoding of certain signals, the memory B is effectively cut off (e.g., disconnected) from the rest of the hardware/circuitry to prevent the idle memory B from corrupting active computation as well as for energy savings. This cutting off of the memory can be effectuated by setting an input to the memory to be 0 (or a maximum value "maxval" using a MUX) for each of the variable nodes and check nodes, respectively, associated with that particular unused sub-matrix that is a null sub-matrix for decoding that particular code.

It is noted that the variable/bit engine connections to the memories A and B are not depicted in this diagram, and the variable/bit engine connections to the memory C are not depicted in the following diagram. However, those having an average skill in the art, when presented with the check engine connectivity presented herein will be able to understand the correlative variable/bit node connectivity as well.

As can be seen, memories A and B can be merged into a singular memory C. Memory C is then active when decoding signals encoded in accordance with code 0, 1, 2, and code 3, and is idle when decoding signals encoded to all other codes.

It is also noted here that merged memories maintain all of the connectivity that would be present if they were provisioned independently. In this example depicted in FIG. 15 and FIG. 16, the original connectivity of the memory A and the memory B (in FIG. 15) is maintained when using the memory C (in FIG. 16).

For example, considering the embodiment where memory A and memory B have mutually exclusive code sets, and also considering that memory A is in a different sub-matrix row from the memory B (e.g., each of memory A and memory B correspond to sub-matrices in different locations within the overall LDPC matrix), then the memory A and the memory B would connect to different check nodes and can be merged into memory C. Also, memory C should maintain the connectivity to both the check nodes to which memory A is connected and also maintain the connectivity to the check nodes to which memory B is connected.

FIG. 16 illustrates an embodiment 1600 of connectivity of a merged memory employed for check node processing in accordance with LDPC decoding processing. A two stage embodiment, with 3 MUXs, allows for a single memory C to replace both the memories A and B.

Figure 17:
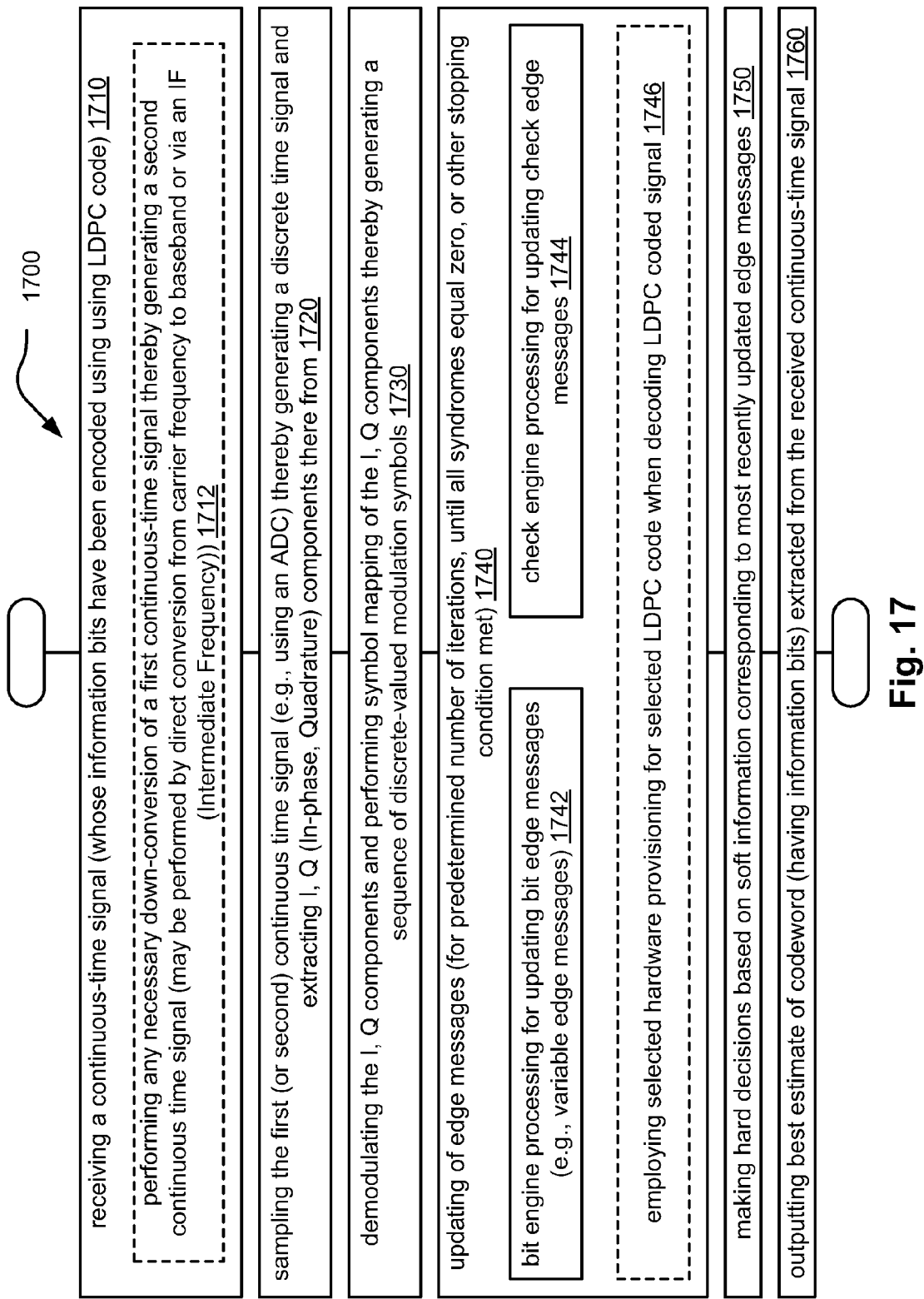
FIG. 17 illustrates an embodiment of a method for processing an LDPC coded signal.

FIG. 17 illustrates an embodiment of a method 1700 for processing an LDPC coded signal.

Referring to the FIG. 17, the method 1700 initially involves receiving a continuous-time signal, as shown in a block 1710. This receiving and processing of the continuous-time signal may also involve performing any necessary down-conversion of a first continuous-time signal thereby generating a second continuous-time signal, as shown in a block 1712. Any frequency conversion that may need to be performed may possibly be performed by direct conversion from carrier frequency to a baseband frequency. This frequency conversion may alternatively be performed via an IF (Intermediate Frequency). In whichever embodiment, the received continuous-time signal is typically brought down in frequency to a baseband continuous-time signal when performing this method. Also, certain types of gain adjustment/gain control may be applied to the received continuous-time signal.

The method 1700 also involves sampling the first (or second) continuous-time signal thereby generating a discrete-time signal and extracting I, Q (In-phase, Quadrature) components there from, as shown in a block 1720. This sampling may be performed using an ADC (Analog to Digital Converter) or equivalent means to generate the discrete-time signal from the appropriately down-converted (and potentially also filtered, gain adjusted, etc.) received continuous-time signal. The I, Q components of the individual samples of the discrete time signal are also extracted within this step. The method 1700 then involves demodulating the I, Q components and can involve performing symbol mapping of the I, Q components (e.g., to a constellation shape having a mapping of the constellation points therein) thereby generating a sequence of discrete-valued modulation symbols, as shown in a block 1730.

The next step of the method 1700 involves performing updating of edge messages until a stopping condition is met (e.g., for a predetermined number of iterations, until all syndromes are equal to zero, or until some other stopping criterion is met), as shown in a block 1740. This step may be viewed as performing the LDPC decoding in accordance with any of the various embodiments described above. This LDPC decoding generally involves bit engine processing for updating bit edge messages (e.g., variable edge messages) (as shown in a block 1742) as well as check engine processing for updating check edge messages (as shown in a block 1744).

As shown in a block 1746, the method 1700 can also involve employing a selected hardware provisioning for a selected LDPC code when decoding the particular LDPC coded signal of interest. For example, the method 1700 is operable to perform processing of different LDPC coded signals that have been generated using different LDPC codes (and consequently can have different LDPC matrices, respectively). Depending on which signal is being decoded, the method 1700 is operable to select the appropriate hardware provisioning to perform decoding of the particular LDPC coded signal of interest.

After the stopping condition has been met, the method 1700 involves making hard decisions based on soft information corresponding to most recently updated bit edge messages, as shown in a block 1750. The method 1700 ultimately involves outputting a best estimate of the LDPC coded bits (e.g., LDPC codeword, or LDPC code block) (that includes the information bits) that has been extracted from the received continuous-time signal, as shown in a block 1760.

Figure 18:
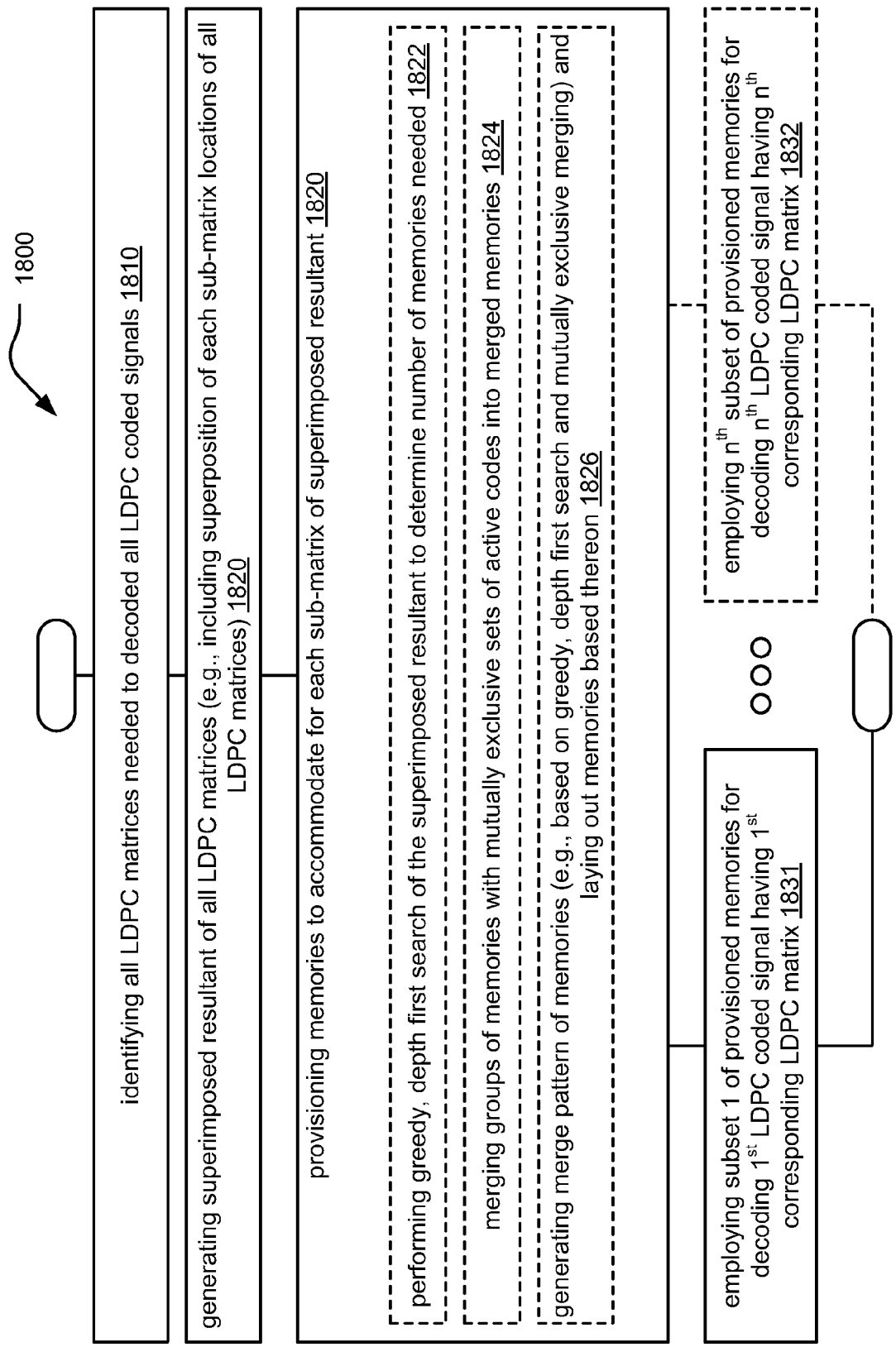
FIG. 18 illustrates an embodiment of a method for processing an LDPC coded signal.

FIG. 18 illustrates an embodiment of a method 1800 for processing an LDPC coded signal.

The method 1800 begins by identifying all LDPC matrices needed to decode all LDPC coded signals, as shown in a block 1810.

The method 1800 then continues by generating superimposed resultant of all LDPC matrices (e.g., including superposition of each sub-matrix locations of all LDPC matrices), as shown in a block 1820.

The method 1800 then continues by provisioning memories to accommodate for each sub-matrix of superimposed resultant, as shown in a block 1830. This can be performed any number of ways, and can include any number of steps. In one embodiment, this involves performing a greedy, depth first search of the resulting, superimposed LDPC matrix to determine the number of memories needed (as shown in a block 1822).

Although a polynomial time merging search algorithm can be employed to arrive at a solution of memory provisioning, it does not always give a minimum memory solution. In a 4 node example, the nodes can be considered in alphabetical order.

| Message group | Mergability |
| --- | --- |
| A | B, C |
| B | A, D |
| C | A |
| D | B |

Memory A can be merged with memory B, and then no further merges can take place. A minimum memory solution of this 4 node embodiment would be merging memory A and memory B (e.g., into memory E) and merging memory C and memory D (e.g., into memory F).

A depth first search can also be employed to arrive at a minimum memory solution. Such a full depth first search is inherently exhaustive and will find the actual minimum memory solution. However, certain examples show the difficulty in using this approach. When considering the tree root for a solution adaptable to accommodate the IEEE 802.11n standard, and all of the 12 LDPC codes therein (each having its own corresponding LDPC matrix), then the tree root for the IEEE 802.11n standard has 2041 branches. The results in a maximum tree depth of approximately 105. The search field of $(O(2041)^{105})$ makes a full search infeasible without a great deal of processing, time, etc.

One or more heuristics can be employed to make the searching for the minimum memory requirement (or a relative minimum memory requirement) and the merging of memories within the resulting, superimposed LDPC matrix easier. One such metric that can be employed along these lines is that of column affinity. In addition, certain assumptions made to govern the merge search heuristic can include: (1) variable/bit node are relatively compact to one another and the check nodes are spread over a larger relative area within the resulting, superimposed LDPC matrix and (2) the memories to be provisioned are to be tightly clustered around variable/bit nodes.

This searching can also employ the heuristics that memories belonging to a column of the resulting, superimposed LDPC matrix are tightly clustered, and that check nodes connect different columns together.

The column affinity metric then can be generated based on a column's connectedness to other columns within that particular sub-matrix as well as other sub-matrices within the resulting, superimposed LDPC matrix. As also described below within another embodiment, the column affinity metric can be applied to steer/govern the greedy, depth first search of the superimposed resulting, LDPC matrix.

This can also involve merging groups of memories with mutually exclusive sets of active codes into merged memories, as shown in a block 1824. The method 1800 can also involve generating merge pattern of memories (e.g., based on greedy, depth first search and mutually exclusive merging) and laying out memories based thereon, as shown in a block 1826.

The method 1800 then continues by employing subset 1 of provisioned memories for decoding $1^{st}$ LDPC coded signal having $1^{st}$ corresponding LDPC matrix, as shown in a block 1831.

If multiple LDPC coded signals are to be decoded, then the method 1800 then can also operate by employing $n^{th}$ subset of provisioned memories for decoding $n^{th}$ LDPC coded signal having $n^{th}$ corresponding LDPC matrix, as shown in a block 1832.

Figure 19:
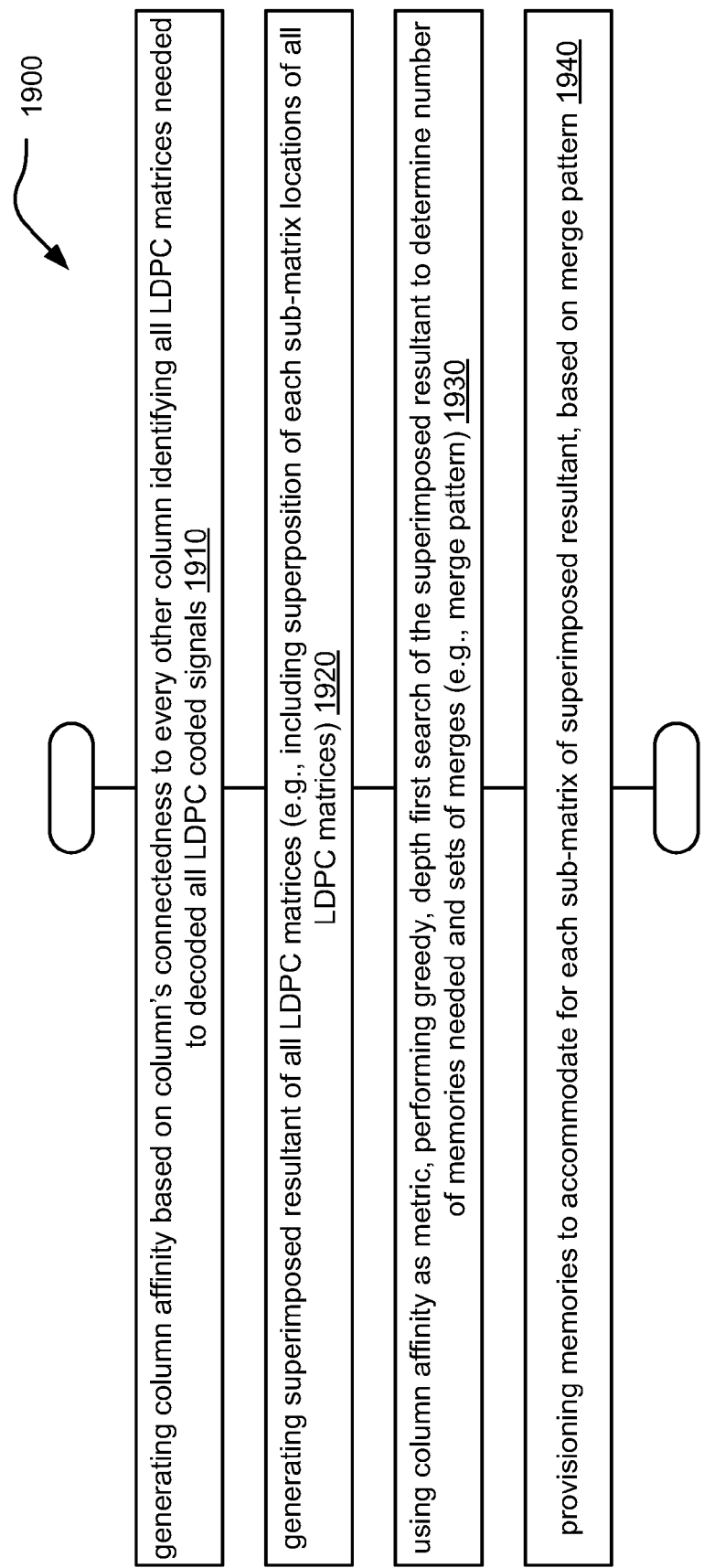
FIG. 19 illustrates an embodiment of a method for provisioning of hardware for processing various LDPC coded signals.

FIG. 19 illustrates an embodiment of a method 1900 for provisioning of hardware for processing various LDPC coded signals.

The method 1900 begins by generating column affinity based on column's connectedness to every other column identifying all LDPC matrices needed to decoded all LDPC coded signals, as shown in a block 1910.

The method 1900 then continues by generating superimposed resultant of all LDPC matrices (e.g., including superposition of each sub-matrix locations of all LDPC matrices), as shown in a block 1920.

The method 1900 then continues by using column affinity as metric, performing greedy, depth first search of the superimposed resultant to determine number of memories needed and sets of merges (e.g., merge pattern), as shown in a block 1930.

The method 1900 then continues by provisioning memories to accommodate for each sub-matrix of superimposed resultant, based on merge pattern, as shown in a block 1940.

Figure 20:
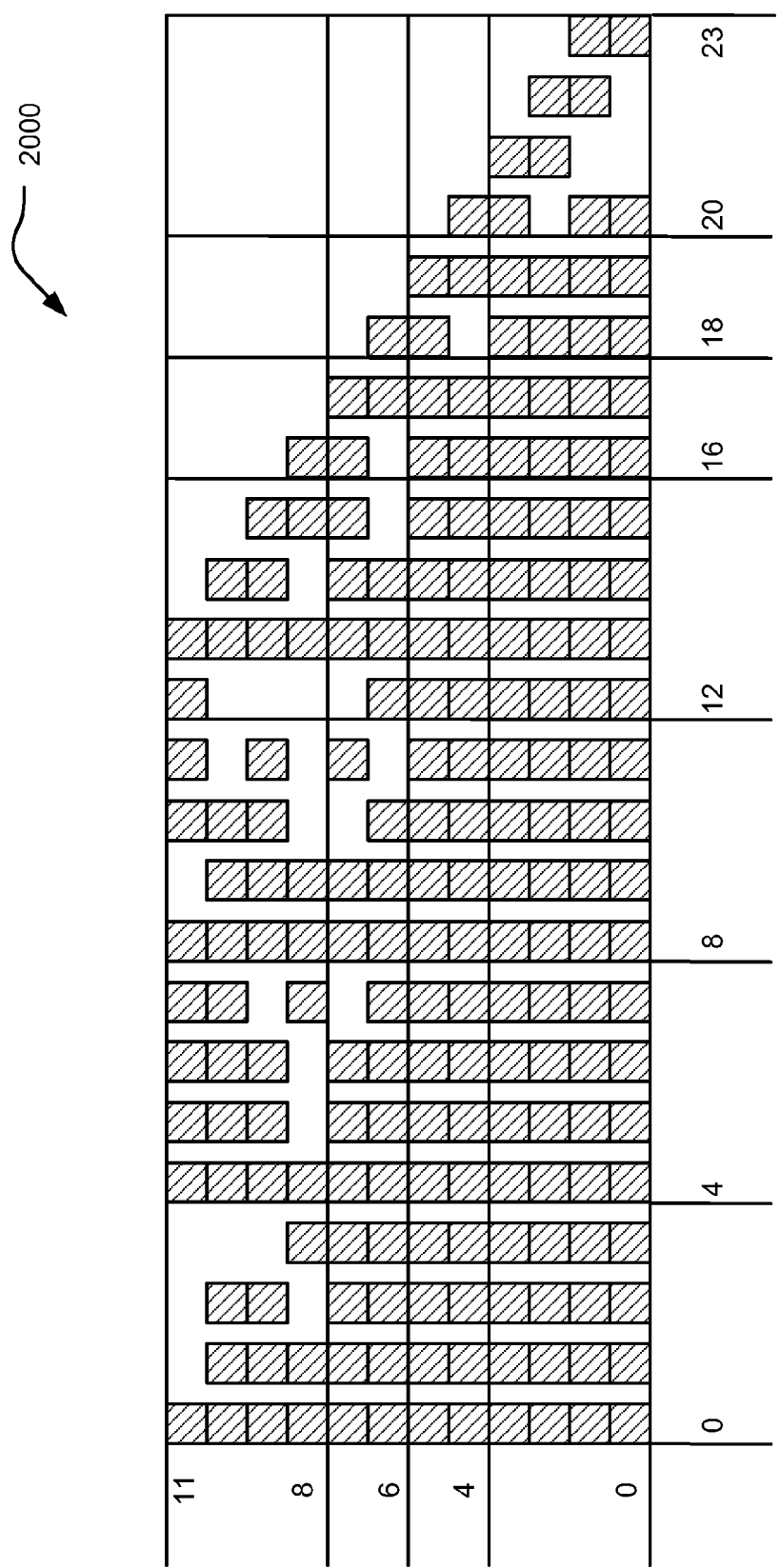
FIG. 20 illustrates an alternative embodiment of a superimposed LDPC matrix.

FIG. 20 illustrates an alternative embodiment 2000 of a superimposed LDPC matrix. This embodiment 2000 corresponds to the superposition of the 12 separate LDPC matrix required to perform decoding processing of the 12 codes employed within the IEEE 802.11n standard. When superimposing the 12 separate LDPC matrix (and each of their respective sub-matrices), there is a total of 205 non-null sub-matrices in the resulting, superimposed LDPC matrix.

Messages corresponding to each non-null sub-matrix can be stored in memories. Check and bit engines are implemented so that they can appropriately and selectively read messages from and write messages into the memories implemented to represent each of the appropriate non-null sub-matrices required for decoding that particular signal that has been encoded in accordance with one of the 12 codes employed within the IEEE 802.11n standard.

In this embodiment, only 88 memories of the 205 are employed/active at any time. At least 117 memories of the 205 are always idle. Clearly, a first subset of 88 of the 205 memories can be employed when decoding a first coded signal, and a second subset of 88 of the 205 memories can be employed when decoding a second coded signal.

This number of 205 provisioned memories can be reduced significantly by employing a merge pattern and employing a minimum number (which may not necessarily be the 'true' minimum) as found using a greedy, depth first search of the resulting, superimposed LDPC matrix to determine the number of memories needed. One such merge pattern is depicted in the following APPENDIX, and that particular merge pattern was achieved using the greedy, depth first search of the superimposed resulting, LDPC matrix with the column affinity as a metric. This merge pattern only requires the use of 102 provisioned memories (vs. 205). As can be seen, this is a memory savings of approximately 50%, and it also resulted in very negligible routing impact. While it is in fact possible to find a solution with fewer memories required than even 102 (e.g., using a full depth first search), it was found that the use of 102 provisioned memories (e.g., as found using a greedy, depth first search) provided a relatively good trade-off of area and congestion.

When a particular memory is unused during decoding of a particular signal, that memory can effectively be cut off (e.g., disconnected) from the rest of the circuitry to prevent the idle memory from corrupting active computation as well as for energy savings. This cutting off of the memory can be effectuated by setting an input to the memory to be 0 (or a maximum value "maxval") for each of the variable nodes and check nodes, respectively, associated with that particular unused sub-matrix that is a null sub-matrix for decoding that particular code.

It is also noted that the multi-code approach presented herein can be employed on any sub-matrix/sub-block based LDPC decoder where messages corresponding to sub-matrices/sub-blocks are stored in some kind of memory (e.g., SRAM, collection of registers, etc.). Moreover, the heuristics employed when trying to arrive at a more efficient memory solution can be more finely tuned depending on backend implementation details. In other words, depending on the particular application into which a multi-code LDPC decoder is desired to be implemented, then the heuristics can be more finely tuned for that particular application.

It is noted that any of the various modules (e.g., encoders, decoders, processing modules, etc.) described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory, random access memory, volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

APPENDIX INTRODUCTION

There are several means and embodiments by which merge patterns can be generated to direct the provisioning of hardware for use in a single device for use in decoding multiple LDPC coded signals. One possible embodiment is directed to decoding all 12 codes employed within the IEEE 802.11n standard.

In this embodiment, it can be seen that, when employing the merging searching, only 102 memories are required as opposed to the 205 employed when using a straightforward superposition approach.

APPENDIX

Merge Pattern

Unmerged Memory, Row 0 Col 0, Code 0 (0, 0), Code 1 (0, 0), Code 2 (0, 0), Code 3 (0, 0), Code 4 (0, 0), Code 5 (0, 0), Code 6 (0, 0), Code 7 (0, 0), Code 8 (0, 0), Code 9 (0, 0), Code 10 (0, 0), Code 11 (0, 0)

Unmerged Memory, Row 0 Col 2, Code 1 (0, 2), Code 2 (0, 2), Code 3 (0, 2), Code 4 (0, 2), Code 5 (0, 2), Code 6 (0, 2), Code 7 (0, 2), Code 8 (0, 2), Code 9 (0, 2), Code 10 (0, 2), Code 11 (0, 2)

Unmerged Memory, Row 0 Col 3, Code 1 (0, 3), Code 2 (0, 3), Code 3 (0, 3), Code 5 (0, 3), Code 6 (0, 3), Code 7 (0, 3), Code 9 (0, 3), Code 10 (0, 3), Code 11 (0, 3)

Unmerged Memory, Row 0 Col 4, Code 0 (0, 4), Code 2 (0, 4), Code 3 (0, 4), Code 4 (0, 4), Code 5 (0, 4), Code 6 (0, 4), Code 7 (0, 4), Code 8 (0, 4), Code 9 (0, 4), Code 10 (0, 4), Code 11 (0, 4)

Unmerged Memory, Row 0 Col 7, Code 0 (0, 7), Code 1 (0, 7), Code 2 (0, 7), Code 3 (0, 7), Code 7 (0, 7), Code 8 (0, 7), Code 9 (0, 7), Code 10 (0, 7), Code 11 (0, 7)

Unmerged Memory, Row 0 Col 8, Code 0 (0, 8), Code 3 (0, 8), Code 4 (0, 8), Code 5 (0, 8), Code 6 (0, 8), Code 7 (0, 8), Code 8 (0, 8), Code 9 (0, 8), Code 11 (0, 8)

Unmerged Memory, Row 0 Col 23, Code 0 (0, 23), Code 1 (0, 23), Code 2 (0, 23), Code 3 (0, 23), Code 4 (0, 23), Code 5 (0, 23), Code 6 (0, 23), Code 7 (0, 23), Code 8 (0, 23), Code 9 (0, 23), Code 10 (0, 23), Code 11 (0, 23)

Unmerged Memory, Row 1 Col 0, Code 0 (1, 0), Code 1 (1, 0), Code 2 (1, 0), Code 3 (1, 0), Code 5 (1, 0), Code 6 (1, 0), Code 7 (1, 0), Code 8 (1, 0), Code 9 (1, 0), Code 10 (1, 0), Code 11 (1, 0)

Unmerged Memory, Row 1 Col 1, Code 1 (1, 1), Code 2 (1, 1), Code 3 (1, 1), Code 4 (1, 1), Code 5 (1, 1), Code 6 (1, 1), Code 7 (1, 1), Code 8 (1, 1), Code 9 (1, 1), Code 10 (1, 1), Code 11 (1, 1)

Unmerged Memory, Row 1 Col 2, Code 0 (1, 2), Code 1 (1, 2), Code 2 (1, 2), Code 3 (1, 2), Code 5 (1, 2), Code 6 (1, 2), Code 7 (1, 2), Code 9 (1, 2), Code 10 (1, 2), Code 11 (1, 2)

Unmerged Memory, Row 1 Col 4, Code 0 (1, 4), Code 1 (1, 4), Code 2 (1, 4), Code 3 (1, 4), Code 4 (1, 4), Code 5 (1, 4), Code 6 (1, 4), Code 7 (1, 4), Code 8 (1, 4), Code 9 (1, 4), Code 10 (1, 4), Code 11 (1, 4)

Unmerged Memory, Row 1 Col 5, Code 0 (1, 5), Code 3 (1, 5), Code 6 (1, 5), Code 7 (1, 5), Code 9 (1, 5), Code 10 (1, 5), Code 11 (1, 5)

Unmerged Memory, Row 1 Col 7, Code 0 (1, 7), Code 2 (1, 7), Code 3 (1, 7), Code 4 (1, 7), Code 5 (1, 7), Code 6 (1, 7), Code 7 (1, 7), Code 9 (1, 7), Code 10 (1, 7), Code 11 (1, 7)

Unmerged Memory, Row 1 Col 8, Code 0 (1, 8), Code 1 (1, 8), Code 2 (1, 8), Code 3 (1, 8), Code 4 (1, 8), Code 7 (1, 8), Code 10 (1, 8), Code 11 (1, 8)

Unmerged Memory, Row 1 Col 22, Code 0 (1, 22), Code 1 (1, 22), Code 2 (1, 22), Code 3 (1, 22), Code 4 (1, 22), Code 5 (1, 22), Code 6 (1, 22), Code 7 (1, 22), Code 8 (1, 22), Code 9 (1, 22), Code 10 (1, 22), Code 11 (1, 22)

Unmerged Memory, Row 1 Col 23, Code 0 (1, 23), Code 1 (1, 23), Code 2 (1, 23), Code 3 (1, 23), Code 4 (1, 23), Code 5 (1, 23), Code 6 (1, 23), Code 7 (1, 23), Code 8 (1, 23), Code 9 (1, 23), Code 10 (1, 23), Code 11 (1, 23)

Unmerged Memory, Row 2 Col 0, Code 0 (2, 0), Code 1 (2, 0), Code 2 (2, 0), Code 3 (2, 0), Code 4 (2, 0), Code 5 (2, 0), Code 6 (2, 0), Code 7 (2, 0), Code 9 (2, 0), Code 10 (2, 0), Code 11 (2, 0)

Unmerged Memory, Row 2 Col 1, Code 1 (2, 1), Code 2 (2, 1), Code 3 (2, 1), Code 5 (2, 1), Code 6 (2, 1), Code 7 (2, 1), Code 8 (2, 1), Code 9 (2, 1), Code 10 (2, 1), Code 11 (2, 1)

Unmerged Memory, Row 2 Col 2, Code 1 (2, 2), Code 2 (2, 2), Code 3 (2, 2), Code 4 (2, 2), Code 5 (2, 2), Code 6 (2, 2), Code 7 (2, 2), Code 9 (2, 2), Code 10 (2, 2), Code 11 (2, 2)

Unmerged Memory, Row 2 Col 3, Code 1 (2, 3), Code 2 (2, 3), Code 3 (2, 3), Code 5 (2, 3), Code 6 (2, 3), Code 7 (2, 3), Code 8 (2, 3), Code 9 (2, 3), Code 10 (2, 3), Code 11 (2, 3)

Unmerged Memory, Row 2 Col 4, Code 0 (2, 4), Code 2 (2, 4), Code 3 (2, 4), Code 4 (2, 4), Code 5 (2, 4), Code 6 (2, 4), Code 7 (2, 4), Code 8 (2, 4), Code 9 (2, 4), Code 10 (2, 4), Code 11 (2, 4)

Unmerged Memory, Row 2 Col 8, Code 0 (2, 8), Code 2 (2, 8), Code 3 (2, 8), Code 4 (2, 8), Code 6 (2, 8), Code 7 (2, 8), Code 8 (2, 8), Code 10 (2, 8), Code 11 (2, 8)

Unmerged Memory, Row 2 Col 21, Code 0 (2, 21), Code 1 (2, 21), Code 2 (2, 21), Code 3 (2, 21), Code 4 (2, 21), Code 5 (2, 21), Code 6 (2, 21), Code 7 (2, 21), Code 8 (2, 21), Code 9 (2, 21), Code 10 (2, 21), Code 11 (2, 21)

Unmerged Memory, Row 2 Col 22, Code 0 (2, 22), Code 1 (2, 22), Code 2 (2, 22), Code 3 (2, 22), Code 4 (2, 22), Code 5 (2, 22), Code 6 (2, 22), Code 7 (2, 22), Code 8 (2, 22), Code 9 (2, 22), Code 10 (2, 22), Code 11 (2, 22)

Unmerged Memory, Row 3 Col 0, Code 0 (3, 0), Code 1 (3, 0), Code 2 (3, 0), Code 3 (3, 0), Code 4 (3, 0), Code 5 (3, 0), Code 6 (3, 0), Code 7 (3, 0), Code 8 (3, 0), Code 9 (3, 0), Code 10 (3, 0), Code 11 (3, 0)

Unmerged Memory, Row 3 Col 1, Code 0 (3, 1), Code 1 (3, 1), Code 2 (3, 1), Code 3 (3, 1), Code 5 (3, 1), Code 6 (3, 1), Code 7 (3, 1), Code 9 (3, 1), Code 10 (3, 1), Code 11 (3, 1)

Unmerged Memory, Row 3 Col 2, Code 1 (3, 2), Code 2 (3, 2), Code 3 (3, 2), Code 5 (3, 2), Code 6 (3, 2), Code 7 (3, 2), Code 9 (3, 2), Code 10 (3, 2), Code 11 (3, 2)

Unmerged Memory, Row 3 Col 3, Code 0 (3, 3), Code 2 (3, 3), Code 3 (3, 3), Code 4 (3, 3), Code 5 (3, 3), Code 6 (3, 3), Code 7 (3, 3), Code 9 (3, 3), Code 10 (3, 3), Code 11 (3, 3)

Unmerged Memory, Row 3 Col 4, Code 0 (3, 4), Code 1 (3, 4), Code 2 (3, 4), Code 3 (3, 4), Code 4 (3, 4), Code 5 (3, 4), Code 6 (3, 4), Code 7 (3, 4), Code 8 (3, 4), Code 10 (3, 4), Code 11 (3, 4)

Unmerged Memory, Row 3 Col 5, Code 0 (3, 5), Code 2 (3, 5), Code 3 (3, 5), Code 5 (3, 5), Code 6 (3, 5), Code 7 (3, 5), Code 8 (3, 5), Code 9 (3, 5), Code 10 (3, 5), Code 11 (3, 5)

Unmerged Memory, Row 3 Col 8, Code 0 (3, 8), Code 1 (3, 8), Code 2 (3, 8), Code 3 (3, 8), Code 4 (3, 8), Code 7 (3, 8), Code 8 (3, 8), Code 9 (3, 8), Code 10 (3, 8), Code 11 (3, 8)

Unmerged Memory, Row 3 Col 20, Code 0 (3, 20), Code 1 (3, 20), Code 2 (3, 20), Code 3 (3, 20), Code 4 (3, 20), Code 5 (3, 20), Code 6 (3, 20), Code 7 (3, 20), Code 8 (3, 20), Code 9 (3, 20), Code 10 (3, 20), Code 11 (3, 20)

Unmerged Memory, Row 3 Col 21, Code 0 (3, 21), Code 1 (3, 21), Code 2 (3, 21), Code 3 (3, 21), Code 4 (3, 21), Code 5 (3, 21), Code 6 (3, 21), Code 7 (3, 21), Code 8 (3, 21), Code 9 (3, 21), Code 10 (3, 21), Code 11 (3, 21)

Unmerged Memory, Row 4 Col 1, Code 0 (4, 1), Code 1 (4, 1), Code 2 (4, 1), Code 3 (4, 1), Code 5 (4, 1), Code 6 (4, 1), Code 7 (4, 1), Code 9 (4, 1), Code 10 (4, 1), Code 11 (4, 1)

Unmerged Memory, Row 4 Col 2, Code 1 (4, 2), Code 2 (4, 2), Code 3 (4, 2), Code 4 (4, 2), Code 5 (4, 2), Code 6 (4, 2), Code 7 (4, 2), Code 9 (4, 2), Code 10 (4, 2), Code 11 (4, 2)

Unmerged Memory, Row 4 Col 3, Code 1 (4, 3), Code 2 (4, 3), Code 3 (4, 3), Code 6 (4, 3), Code 7 (4, 3), Code 9 (4, 3), Code 10 (4, 3), Code 11 (4, 3)

Unmerged Memory, Row 4 Col 4, Code 0 (4, 4), Code 2 (4, 4), Code 3 (4, 4), Code 4 (4, 4), Code 5 (4, 4), Code 6 (4, 4), Code 7 (4, 4), Code 8 (4, 4), Code 9 (4, 4), Code 10 (4, 4), Code 11 (4, 4)

Unmerged Memory, Row 4 Col 5, Code 1 (4, 5), Code 2 (4, 5), Code 3 (4, 5), Code 5 (4, 5), Code 6 (4, 5), Code 7 (4, 5), Code 8 (4, 5), Code 10 (4, 5), Code 11 (4, 5)

Unmerged Memory, Row 5 Col 0, Code 0 (5, 0), Code 1 (5, 0), Code 2 (5, 0), Code 3 (5, 0), Code 4 (5, 0), Code 5 (5, 0), Code 6 (5, 0), Code 7 (5, 0), Code 8 (5, 0), Code 9 (5, 0), Code 10 (5, 0), Code 11 (5, 0)

Unmerged Memory, Row 5 Col 1, Code 1 (5, 1), Code 2 (5, 1), Code 3 (5, 1), Code 4 (5, 1), Code 5 (5, 1), Code 6 (5, 1), Code 7 (5, 1), Code 8 (5, 1), Code 9 (5, 1), Code 10 (5, 1), Code 11 (5, 1)

Unmerged Memory, Row 5 Col 2, Code 1 (5, 2), Code 2 (5, 2), Code 3 (5, 2), Code 5 (5, 2), Code 6 (5, 2), Code 7 (5, 2), Code 8 (5, 2), Code 9 (5, 2), Code 10 (5, 2), Code 11 (5, 2)

Unmerged Memory, Row 5 Col 4, Code 0 (5, 4), Code 1 (5, 4), Code 2 (5, 4), Code 3 (5, 4), Code 5 (5, 4), Code 6 (5, 4), Code 7 (5, 4), Code 9 (5, 4), Code 10 (5, 4), Code 11 (5, 4)

Unmerged Memory, Row 5 Col 6, Code 1 (5, 6), Code 2 (5, 6), Code 3 (5, 6), Code 5 (5, 6), Code 6 (5, 6), Code 7 (5, 6), Code 8 (5, 6), Code 9 (5, 6), Code 11 (5, 6)

Unmerged Memory, Row 5 Col 8, Code 0 (5, 8), Code 1 (5, 8), Code 2 (5, 8), Code 3 (5, 8), Code 4 (5, 8), Code 7 (5, 8), Code 8 (5, 8), Code 11 (5, 8)

Merged Memory, Code 0 (11, 8), Code 1 (2, 5), Code 3 (2, 5), Code 4 (11, 8), Code 6 (2, 5), Code 7 (2, 5), Code 8 (11, 8), Code 10 (2, 5), Code 11 (2, 5)

Merged Memory, Code 0 (8, 3), Code 1 (1, 3), Code 2 (1, 3), Code 3 (1, 3), Code 4 (8, 3), Code 5 (1, 3), Code 6 (1, 3), Code 7 (1, 3), Code 8 (1, 3), Code 9 (1, 3), Code 10 (1, 3), Code 11 (1, 3)

Merged Memory, Code 0 (4, 19), Code 1 (4, 19), Code 2 (4, 19), Code 3 (3, 19), Code 4 (4, 19), Code 5 (4, 19), Code 6 (4, 19), Code 7 (3, 19), Code 8 (4, 19), Code 9 (4, 19), Code 10 (4, 19)

Merged Memory, Code 0 (10, 0), Code 1 (7, 2), Code 2 (4, 17), Code 3 (3, 17), Code 4 (10, 0), Code 5 (7, 2), Code 6 (3, 17), Code 8 (10, 0), Code 9 (7, 2), Code 10 (3, 17), Code 11 (3, 17)

Merged Memory, Code 0 (9, 0), Code 1 (6, 1), Code 3 (0, 20), Code 4 (9, 0), Code 5 (6, 1), Code 6 (5, 7), Code 7 (0, 20), Code 8 (9, 0), Code 9 (6, 1), Code 10 (4, 11), Code 11 (0, 20)

Merged Memory, Code 0 (6, 18), Code 1 (6, 18), Code 2 (2, 18), Code 3 (2, 18), Code 4 (6, 18), Code 5 (6, 18), Code 6 (2, 18), Code 7 (2, 18), Code 8 (6, 18), Code 9 (6, 18), Code 10 (2, 18), Code 11 (2, 18)

Merged Memory, Code 0 (4, 20), Code 1 (4, 20), Code 2 (4, 20), Code 3 (1, 20), Code 4 (4, 20), Code 5 (4, 20), Code 6 (4, 20), Code 7 (1, 20), Code 8 (4, 20), Code 9 (4, 20), Code 10 (4, 20), Code 11 (1, 20)

Merged Memory, Code 0 (7, 0), Code 1 (7, 0), Code 2 (0, 18), Code 3 (0, 18), Code 4 (7, 0), Code 5 (7, 0), Code 6 (0, 18), Code 8 (7, 0), Code 9 (7, 0), Code 10 (0, 18), Code 11 (0, 18)

Merged Memory, Code 0 (11, 13), Code 1 (7, 13), Code 3 (3, 13), Code 4 (11, 13), Code 6 (3, 13), Code 7 (3, 13), Code 8 (11, 13), Code 9 (7, 13), Code 10 (3, 13), Code 11 (3, 13)

Merged Memory, Code 0 (8, 0), Code 1 (7, 1), Code 2 (2, 16), Code 3 (2, 16), Code 4 (8, 0), Code 5 (7, 1), Code 6 (2, 16), Code 7 (2, 16), Code 8 (8, 0), Code 9 (7, 1), Code 10 (2, 16), Code 11 (2, 16)

Merged Memory, Code 0 (11, 0), Code 1 (5, 3), Code 2 (5, 3), Code 3 (2, 19), Code 4 (11, 0), Code 5 (5, 3), Code 6 (5, 3), Code 8 (11, 0), Code 9 (5, 3), Code 10 (5, 3), Code 11 (2, 19)

Merged Memory, Code 0 (6, 17), Code 1 (6, 17), Code 3 (2, 17), Code 4 (6, 17), Code 5 (6, 17), Code 6 (4, 16), Code 7 (2, 17), Code 8 (6, 17), Code 9 (6, 17), Code 10 (2, 17), Code 11 (2, 17)

Merged Memory, Code 0 (4, 0), Code 1 (4, 0), Code 2 (4, 0), Code 3 (1, 19), Code 4 (4, 0), Code 5 (4, 0), Code 6 (4, 0), Code 7 (1, 19), Code 8 (4, 0), Code 9 (4, 0), Code 10 (4, 0), Code 11 (1, 19)

Merged Memory, Code 0 (8, 16), Code 1 (0, 16), Code 2 (5, 16), Code 3 (0, 16), Code 4 (8, 16), Code 5 (0, 16), Code 6 (0, 16), Code 7 (0, 16), Code 8 (8, 16), Code 9 (0, 16), Code 10 (5, 16), Code 11 (0, 16)

Merged Memory, Code 0 (5, 19), Code 1 (5, 19), Code 2 (5, 19), Code 3 (0, 19), Code 4 (5, 19), Code 5 (5, 19), Code 6 (5, 19), Code 7 (0, 19), Code 8 (5, 19), Code 9 (5, 19), Code 10 (5, 19), Code 11 (0, 19)

Merged Memory, Code 0 (7, 17), Code 1 (7, 17), Code 2 (1, 17), Code 3 (1, 17), Code 4 (7, 17), Code 5 (7, 17), Code 6 (1, 17), Code 7 (1, 17), Code 8 (7, 17), Code 9 (7, 17), Code 11 (1, 17)

Merged Memory, Code 0 (5, 12), Code 1 (6, 5), Code 2 (5, 12), Code 3 (2, 12), Code 4 (5, 12), Code 5 (5, 12), Code 6 (2, 12), Code 7 (2, 12), Code 8 (5, 12), Code 9 (2, 12), Code 10 (2, 12), Code 11 (2, 12)

Merged Memory, Code 0 (9, 15), Code 1 (7, 15), Code 3 (2, 15), Code 4 (9, 15), Code 5 (7, 15), Code 6 (5, 15), Code 7 (2, 15), Code 8 (9, 15), Code 9 (7, 15), Code 10 (5, 15), Code 11 (2, 15)

Merged Memory, Code 0 (11, 12), Code 1 (7, 6), Code 2 (4, 12), Code 3 (3, 18), Code 4 (11, 12), Code 5 (7, 6), Code 6 (4, 12), Code 7 (3, 18), Code 8 (11, 12), Code 9 (4, 12), Code 10 (4, 12), Code 11 (3, 18)

Merged Memory, Code 0 (8, 15), Code 1 (4, 15), Code 2 (3, 15), Code 3 (3, 15), Code 4 (8, 15), Code 6 (3, 15), Code 7 (3, 15), Code 8 (8, 15), Code 9 (6, 9), Code 10 (4, 15), Code 11 (3, 15)

Merged Memory, Code 0 (9, 2), Code 1 (6, 12), Code 4 (9, 1), Code 5 (6, 12), Code 6 (5, 13), Code 7 (1, 12), Code 8 (10, 2), Code 9 (6, 12), Code 10 (1, 12), Code 11 (1, 12)

Merged Memory, Code 0 (6, 0), Code 1 (6, 0), Code 2 (0, 17), Code 3 (0, 17), Code 4 (6, 0), Code 5 (6, 0), Code 6 (5, 17), Code 7 (0, 17), Code 8 (6, 0), Code 9 (6, 0), Code 10 (5, 17)

Merged Memory, Code 0 (8, 4), Code 1 (3, 12), Code 2 (3, 12), Code 3 (3, 12), Code 4 (8, 4), Code 5 (3, 12), Code 7 (3, 12), Code 8 (8, 4), Code 9 (7, 14)

Merged Memory, Code 0 (9, 4), Code 1 (1, 15), Code 2 (1, 15), Code 3 (1, 15), Code 4 (9, 4), Code 5 (1, 15), Code 6 (1, 15), Code 7 (1, 15), Code 8 (9, 4), Code 9 (1, 15), Code 11 (1, 15)

Merged Memory, Code 0 (0, 12), Code 1 (0, 12), Code 2 (5, 10), Code 3 (0, 12), Code 4 (0, 12), Code 6 (0, 12), Code 7 (0, 12), Code 8 (0, 12), Code 9 (5, 10), Code 10 (5, 10), Code 11 (0, 12)

Merged Memory, Code 0 (10, 4), Code 2 (0, 15), Code 3 (0, 15), Code 4 (10, 4), Code 5 (0, 15), Code 7 (0, 15), Code 8 (10, 4), Code 9 (0, 15), Code 10 (0, 15)

Merged Memory, Code 0 (5, 18), Code 1 (5, 18), Code 2 (5, 18), Code 3 (1, 18), Code 4 (5, 18), Code 5 (5, 18), Code 6 (5, 18), Code 7 (1, 18), Code 8 (5, 18), Code 9 (5, 18), Code 10 (5, 18)

Merged Memory, Code 0 (10, 13), Code 1 (6, 7), Code 2 (1, 13), Code 3 (1, 13), Code 4 (10, 13), Code 5 (1, 13), Code 6 (1, 13), Code 7 (1, 13), Code 8 (10, 13), Code 9 (6, 7), Code 11 (1, 13)

Merged Memory, Code 0 (7, 16), Code 1 (7, 16), Code 3 (1, 16), Code 4 (7, 16), Code 5 (7, 16), Code 8 (7, 16), Code 9 (7, 16), Code 10 (1, 16)

Merged Memory, Code 0 (11, 4), Code 1 (2, 13), Code 2 (2, 13), Code 3 (2, 13), Code 4 (11, 4), Code 5 (2, 13), Code 7 (2, 13), Code 8 (11, 4), Code 9 (2, 13)

Merged Memory, Code 0 (9, 8), Code 1 (3, 16), Code 2 (3, 16), Code 3 (3, 16), Code 4 (10, 5), Code 5 (3, 16), Code 7 (3, 16), Code 8 (9, 8), Code 9 (3, 16), Code 11 (3, 16)

Merged Memory, Code 0 (10, 1), Code 1 (4, 13), Code 3 (3, 7), Code 4 (10, 1), Code 5 (4, 13), Code 6 (3, 7), Code 7 (3, 7), Code 8 (8, 1), Code 9 (4, 13), Code 10 (4, 13), Code 11 (3, 7)

Merged Memory, Code 0 (10, 14), Code 1 (6, 14), Code 3 (2, 14), Code 4 (10, 14), Code 5 (6, 14), Code 6 (2, 14), Code 7 (2, 14), Code 8 (10, 14), Code 9 (2, 14), Code 11 (2, 14)

Merged Memory, Code 0 (11, 11), Code 1 (4, 7), Code 2 (4, 7), Code 3 (3, 11), Code 4 (3, 11), Code 5 (4, 7), Code 6 (3, 11), Code 7 (3, 11), Code 8 (3, 11), Code 9 (3, 11), Code 11 (3, 11)

Merged Memory, Code 0 (9, 14), Code 2 (4, 14), Code 3 (1, 14), Code 4 (9, 14), Code 5 (4, 14), Code 6 (4, 14), Code 7 (1, 14), Code 8 (9, 14), Code 10 (1, 14)

Merged Memory, Code 0 (2, 11), Code 1 (2, 11), Code 2 (2, 11), Code 3 (2, 11), Code 4 (9, 11), Code 5 (2, 11), Code 7 (2, 11), Code 8 (6, 11)

Merged Memory, Code 0 (11, 5), Code 1 (0, 14), Code 2 (5, 14), Code 3 (0, 14), Code 4 (9, 6), Code 5 (5, 14), Code 6 (0, 14), Code 7 (0, 14), Code 8 (9, 5), Code 9 (5, 14), Code 10 (0, 14), Code 11 (0, 14)

Merged Memory, Code 0 (7, 11), Code 1 (7, 11), Code 2 (0, 13), Code 3 (0, 13), Code 4 (11, 6), Code 5 (7, 11), Code 7 (0, 13), Code 8 (11, 6), Code 9 (7, 11), Code 10 (0, 13), Code 11 (0, 13)

Merged Memory, Code 0 (6, 4), Code 1 (3, 14), Code 2 (3, 14), Code 3 (3, 14), Code 4 (6, 4), Code 5 (6, 4), Code 7 (3, 14), Code 8 (6, 4), Code 10 (3, 14), Code 11 (3, 14)

Merged Memory, Code 0 (10, 6), Code 1 (5, 11), Code 2 (3, 10), Code 3 (3, 10), Code 4 (11, 7), Code 5 (7, 3), Code 6 (5, 11), Code 7 (3, 10), Code 8 (7, 3), Code 9 (7, 3), Code 10 (5, 11), Code 11 (3, 10)

Merged Memory, Code 0 (7, 10), Code 1 (6, 10), Code 3 (0, 10), Code 4 (6, 10), Code 6 (0, 10), Code 7 (0, 10), Code 8 (11, 10), Code 9 (6, 10)

Merged Memory, Code 0 (10, 7), Code 2 (1, 11), Code 3 (1, 11), Code 4 (7, 5), Code 5 (7, 5), Code 6 (1, 11), Code 7 (1, 11), Code 8 (7, 7), Code 9 (1, 11), Code 11 (1, 11)

Merged Memory, Code 0 (2, 10), Code 2 (2, 10), Code 3 (2, 10), Code 4 (2, 10), Code 5 (2, 10), Code 6 (2, 10), Code 7 (2, 10), Code 8 (10, 9), Code 11 (2, 10)

Merged Memory, Code 0 (8, 9), Code 2 (0, 11), Code 3 (0, 11), Code 4 (0, 11), Code 5 (0, 11), Code 7 (0, 11), Code 8 (0, 11), Code 10 (0, 11), Code 11 (0, 11)

Merged Memory, Code 0 (9, 10), Code 1 (4, 10), Code 2 (4, 10), Code 4 (10, 10), Code 5 (4, 10), Code 6 (4, 10), Code 8 (4, 10), Code 9 (4, 10), Code 10 (4, 10)

Merged Memory, Code 0 (5, 9), Code 1 (5, 9), Code 2 (5, 9), Code 4 (7, 9), Code 5 (5, 9), Code 6 (5, 9), Code 8 (9, 9), Code 10 (5, 9)

Merged Memory, Code 0 (4, 6), Code 1 (1, 10), Code 2 (4, 6), Code 3 (1, 10), Code 4 (4, 6), Code 5 (1, 10), Code 6 (4, 6), Code 7 (1, 10), Code 8 (1, 10), Code 10 (1, 10), Code 11 (1, 10)

Merged Memory, Code 0 (0, 9), Code 1 (0, 9), Code 2 (0, 9), Code 3 (0, 9), Code 4 (8, 7), Code 5 (0, 9), Code 7 (0, 9), Code 8 (8, 7), Code 9 (0, 9), Code 11 (0, 9)

Merged Memory, Code 0 (6, 6), Code 1 (1, 6), Code 2 (4, 9), Code 3 (1, 6), Code 4 (4, 9), Code 5 (6, 6), Code 6 (1, 6), Code 7 (1, 6), Code 8 (6, 6), Code 9 (4, 9), Code 10 (4, 9), Code 11 (1, 6)

Merged Memory, Code 0 (6, 2), Code 1 (6, 2), Code 2 (1, 9), Code 3 (1, 9), Code 4 (1, 9), Code 5 (6, 2), Code 6 (1, 9), Code 7 (1, 9), Code 9 (6, 2), Code 11 (1, 9)

Merged Memory, Code 0 (8, 8), Code 1 (3, 6), Code 2 (3, 6), Code 3 (3, 6), Code 4 (8, 8), Code 6 (3, 6), Code 7 (3, 6), Code 8 (8, 8), Code 9 (3, 6), Code 10 (3, 6), Code 11 (3, 6)

Merged Memory, Code 1 (2, 9), Code 2 (5, 5), Code 3 (2, 9), Code 4 (5, 5), Code 6 (5, 5), Code 7 (2, 9), Code 8 (2, 9), Code 9 (5, 5), Code 10 (5, 5), Code 11 (2, 9)

Merged Memory, Code 0 (6, 3), Code 1 (6, 3), Code 2 (0, 6), Code 3 (0, 6), Code 4 (6, 3), Code 5 (6, 3), Code 6 (0, 6), Code 7 (0, 6), Code 9 (6, 3), Code 10 (0, 6), Code 11 (0, 6)

Merged Memory, Code 0 (4, 8), Code 1 (2, 7), Code 2 (2, 7), Code 3 (2, 7), Code 4 (4, 8), Code 5 (2, 7), Code 6 (4, 8), Code 7 (2, 7), Code 8 (4, 8), Code 10 (2, 7), Code 11 (2, 7)

Merged Memory, Code 0 (7, 8), Code 1 (7, 8), Code 3 (2, 6), Code 4 (7, 8), Code 5 (7, 8), Code 6 (2, 6), Code 7 (2, 6), Code 8 (7, 8), Code 9 (2, 6), Code 10 (2, 6), Code 11 (2, 6)

Merged Memory, Code 0 (7, 4), Code 1 (7, 4), Code 3 (3, 9), Code 4 (7, 4), Code 5 (3, 9), Code 6 (3, 9), Code 7 (3, 9), Code 8 (7, 4), Code 9 (7, 4), Code 10 (3, 9), Code 11 (3, 9)

Merged Memory, Code 0 (6, 8), Code 1 (0, 5), Code 2 (0, 5), Code 3 (0, 5), Code 4 (6, 8), Code 5 (6, 8), Code 6 (0, 5), Code 7 (0, 5), Code 8 (6, 8), Code 9 (6, 8), Code 10 (0, 5), Code 11 (0, 5)

Merged Memory, Code 0 (10, 8), Code 1 (0, 1), Code 2 (0, 1), Code 3 (0, 1), Code 4 (10, 8), Code 5 (0, 1), Code 6 (0, 1), Code 7 (0, 1), Code 8 (10, 8), Code 9 (0, 1), Code 10 (0, 1), Code 11 (0, 1)

What is claimed is:

1. An apparatus, comprising:
a plurality of memories including a number of memories corresponding to a plurality of non-null sub-matrices within of a first low density parity check (LDPC) matrix of a first LDPC code and a second LDPC matrix of a second LDPC code;
a plurality of bit engines;
a plurality of check engines; and
a switching module, coupled to the plurality of memories, the plurality of bit engines, and the plurality of check engines, for providing selective connectivity:
between a first subset of the plurality of memories and the plurality of bit engines and also between the first subset of the plurality of memories and the plurality of check engines for decoding of the first LDPC coded signal; and
between a second subset of the plurality of memories and the plurality of bit engines and also between the second subset of the plurality of memories and the plurality of check engines for decoding of the second LDPC coded signal; and wherein:
the first subset of the plurality of memories and the second subset of the plurality of memories including a common memory for storing one of the plurality of non-null sub-matrices having a common row and column location within each of the first LDPC matrix and the second LDPC matrix.

2. The apparatus of claim 1, wherein:
the first subset of the plurality of memories including a number of memories corresponding to a plurality of non-null sub-matrices within the first LDPC matrix of the first LDPC code; and
the second subset of the plurality of memories including a number of memories corresponding to a plurality of non-null sub-matrices within the second LDPC matrix of the second LDPC code.

3. The apparatus of claim 1, wherein:
the plurality of memories implemented in an integrated circuit in accordance with a layout based on a merge pattern considering, at least in part, a column affinity metric indicative of a connectedness of a first column within the first LDPC matrix to at least one of a second column within the first LDPC matrix and a column within the second LDPC matrix.

4. The apparatus of claim 1, wherein:
during bit node processing during decoding of the first LDPC coded signal, the switching module for providing connectivity between the first subset of the plurality of memories and all of the plurality of bit engines; and
during check node processing during decoding of the first LDPC coded signal, the switching module for providing connectivity between the first subset of the plurality of memories and all of the plurality of check engines.

5. The apparatus of claim 1, wherein:
during bit node processing during decoding of the first LDPC coded signal, the switching module for providing connectivity between the first subset of the plurality of memories and a subset of the plurality of bit engines; and
during check node processing during decoding of the first LDPC coded signal, the switching module for providing connectivity between the first subset of the plurality of memories and a subset of the plurality of check engines.

6. The apparatus of claim 1, wherein:
the apparatus being a communication device; and
the communication device operative within at least one of a satellite communication system, a wireless communication system, a wired communication system, and a fiber-optic communication system.

7. An apparatus, comprising:
a plurality of memories including a number of memories corresponding to a plurality of non-null sub-matrices within of a first low density parity check (LDPC) matrix of a first LDPC code and a second LDPC matrix of a second LDPC code;
a plurality of bit engines;
a plurality of check engines; and
a switching module, coupled to the plurality of memories, the plurality of bit engines, and the plurality of check engines, for providing selective connectivity:
between a first subset of the plurality of memories and the plurality of bit engines and also between the first subset of the plurality of memories and the plurality of check engines for decoding of the first LDPC coded signal; and
between a second subset of the plurality of memories and the plurality of bit engines and also between the second subset of the plurality of memories and the plurality of check engines for decoding of the second LDPC coded signal.

8. The apparatus of claim 7, wherein:
the first subset of the plurality of memories including a number of memories corresponding to a plurality of non-null sub-matrices within the first LDPC matrix of the first LDPC code; and
the second subset of the plurality of memories including a number of memories corresponding to a plurality of non-null sub-matrices within the second LDPC matrix of the second LDPC code.

9. The apparatus of claim 7, wherein:
the first subset of the plurality of memories and the second subset of the plurality of memories including at least one common memory.

10. The apparatus of claim 7, wherein:
a row and a column location of a first of the plurality of non-null sub-matrices within the first LDPC matrix same as a row and a column location of a second of the plurality of non-null sub-matrices within the second LDPC matrix.

11. The apparatus of claim 7, wherein:
the plurality of memories implemented in an integrated circuit in accordance with a layout based on a merge pattern considering, at least in part, a column affinity metric indicative of a connectedness of a first column within the first LDPC matrix to at least one of a second column within the first LDPC matrix and a column within the second LDPC matrix.

12. The apparatus of claim 7, wherein:
the number of memories within the plurality of memories determined by superimposing the plurality of non-null sub-matrices within the first LDPC matrix and the second LDPC matrix onto one another.

13. The apparatus of claim 7, wherein:
during bit node processing during decoding of the first LDPC coded signal, the switching module for providing connectivity between the first subset of the plurality of memories and all of the plurality of bit engines; and during check node processing during decoding of the first LDPC coded signal, the switching module for providing connectivity between the first subset of the plurality of memories and all of the plurality of check engines.

14. The apparatus of claim 7, wherein:
during bit node processing during decoding of the first LDPC coded signal, the switching module for providing connectivity between the first subset of the plurality of memories and a subset of the plurality of bit engines; and
during check node processing during decoding of the first LDPC coded signal, the switching module for providing connectivity between the first subset of the plurality of memories and a subset of the plurality of check engines.

15. The apparatus of claim 7, wherein:
the apparatus being a communication device; and
the communication device operative within at least one of a satellite communication system, a wireless communication system, a wired communication system, and a fiber-optic communication system.

16. An apparatus, comprising:
a plurality of memories including a number of memories corresponding to a plurality of non-null sub-matrices within a plurality of low density parity check (LDPC) matrices of a respective plurality of LDPC codes such that each LDPC matrix corresponding to respective one of the LDPC codes;
a plurality of bit engines;
a plurality of check engines; and
a switching module, coupled to the plurality of memories, the plurality of bit engines, and the plurality of check engines, for providing selective connectivity between a respective subset of the plurality of memories and the plurality of bit engines and also between the respective subset of the plurality of memories and the plurality of check engines for decoding of a respective one of a plurality of LDPC coded signals.

17. The apparatus of claim 16, wherein:
during bit node processing during decoding of a first of the plurality of LDPC coded signals, the switching module for providing connectivity between a first subset of the plurality of memories and all of the plurality of bit engines; and
during check node processing during decoding of the first of the plurality of LDPC coded signals, the switching module for providing connectivity between the first subset of the plurality of memories and all of the plurality of bit engines.

18. The apparatus of claim 16, further comprising:
the plurality of memories implemented in an integrated circuit in accordance with a layout based on a merge pattern considering, at least in part, a column affinity metric indicative of a connectedness of a first column within a first of the plurality of LDPC matrices to at least one of a second column within the first of the plurality of LDPC matrices and a column within the second of the plurality of LDPC matrices.

19. The apparatus of claim 16, wherein:
during bit node processing during decoding of a first of the plurality of LDPC coded signals, the switching module for providing connectivity between a first subset of the plurality of memories and a subset of the plurality of bit engines; and
during check node processing during decoding of a first of the plurality of LDPC coded signals, the switching module for providing connectivity between the first subset of the plurality of memories and a subset of the plurality of check engines.

20. The apparatus of claim 16, wherein:
the apparatus being a communication device; and
the communication device operative within at least one of a satellite communication system, a wireless communication system, a wired communication system, and a fiber-optic communication system.

* * * * *